(12) United States Patent
Yamazaki et al.

(10) Patent No.: US 11,610,877 B2
(45) Date of Patent: Mar. 21, 2023

(54) FUNCTIONAL PANEL, DISPLAY DEVICE, INPUT/OUTPUT DEVICE, AND DATA PROCESSING DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 17/098,484

(22) Filed: Nov. 16, 2020

(65) Prior Publication Data

US 2021/0159222 A1    May 27, 2021

(30) Foreign Application Priority Data

Nov. 21, 2019   (JP) .............................. JP2019-210591

(51) Int. Cl.
     *H01L 25/18*     (2006.01)
     *G09G 3/32*     (2016.01)
     *G09G 3/20*     (2006.01)

(52) U.S. Cl.
     CPC ........... *H01L 25/18* (2013.01); *G09G 3/2003* (2013.01); *G09G 3/32* (2013.01); *G09G 2300/0809* (2013.01)

(58) Field of Classification Search
     CPC ....... G09G 2300/04; G09G 2300/0439; G09G 2300/0443; G09G 2300/0809;
(Continued)

(56) References Cited

U.S. PATENT DOCUMENTS 7,358,935 B2    4/2008   Yamashita et al.
9,105,813 B1    8/2015   Chang
(Continued)

FOREIGN PATENT DOCUMENTS

JP    2013-145833 A    7/2013
JP    2014-202778 A    10/2014
(Continued)

*Primary Examiner* — Nitin Patel
*Assistant Examiner* — Amen W Bogale
(74) *Attorney, Agent, or Firm* — Robinson Intellectual Property Law Office; Eric J. Robinson

(57) ABSTRACT

A novel functional panel that is highly convenient or reliable is provided. The functional panel includes a light-emitting region including a first element, a first functional layer, and a second functional layer. The first element includes a first electrode, a second electrode, and a layer containing a light-emitting material. The layer containing a light-emitting material contains gallium nitride. The first functional layer includes a region positioned between the light-emitting region and the second functional layer, and includes a first insulating film. The first insulating film includes a first opening and a second opening on the outside of the light-emitting region. The second functional layer includes a driver circuit. The driver circuit includes a first transistor and a second transistor. The first transistor is electrically connected to the first electrode through the first opening, and the second transistor is electrically connected to the second electrode through the second opening.

17 Claims, 13 Drawing Sheets

(58) Field of Classification Search
CPC ..... G09G 2300/023; G09G 2300/0426; G09G 3/32; G09G 3/3208; G09G 3/3216; G09G 3/3225; H01L 33/507; H01L 25/18; H01L 25/0753
See application file for complete search history.

(56) References Cited

U.S. PATENT DOCUMENTS

| | | | |
|---|---|---|---|
| 9,153,171 B2 | 10/2015 | Sakariya et al. | |
| 9,219,197 B1 | 12/2015 | Chen et al. | |
| 9,231,153 B2 | 1/2016 | Chen et al. | |
| 9,590,137 B2 | 3/2017 | Chen et al. | |
| 10,158,043 B2 | 12/2018 | Chen et al. | |
| 10,559,249 B2 | 2/2020 | Yoneda | |
| 2004/0263425 A1* | 12/2004 | Anzai | G06F 1/32 345/1.1 |
| 2005/0156828 A1 | 7/2005 | Yamashita et al. | |
| 2007/0120785 A1* | 5/2007 | Kimura | G09G 3/325 345/82 |
| 2010/0102752 A1 | 4/2010 | Chen et al. | |
| 2012/0146065 A1* | 6/2012 | Fujii | H01L 33/44 313/504 |
| 2014/0168037 A1 | 6/2014 | Sakariya et al. | |
| 2014/0292745 A1 | 10/2014 | Kikuchi et al. | |
| 2014/0367705 A1 | 12/2014 | Bibl et al. | |
| 2015/0009128 A1* | 1/2015 | Matsumoto | G06F 1/1643 345/76 |
| 2015/0339979 A1 | 11/2015 | Kikuchi et al. | |
| 2015/0349200 A1 | 12/2015 | Chen et al. | |
| 2015/0349285 A1 | 12/2015 | Seo et al. | |
| 2016/0013170 A1 | 1/2016 | Sakariya et al. | |
| 2016/0268513 A1 | 9/2016 | Ishisone et al. | |
| 2017/0062749 A1 | 3/2017 | Seo et al. | |
| 2017/0090246 A1 | 3/2017 | Seo et al. | |
| 2017/0133550 A1 | 5/2017 | Schuele et al. | |
| 2017/0170200 A1 | 6/2017 | Ikeda et al. | |
| 2017/0186365 A1 | 6/2017 | Yoneda | |
| 2018/0012949 A1 | 1/2018 | Takeya et al. | |
| 2018/0122836 A1 | 5/2018 | Kang et al. | |
| 2018/0254226 A1* | 9/2018 | Iguchi | H01L 27/156 |
| 2019/0244937 A1 | 8/2019 | Honjo et al. | |
| 2020/0006688 A1 | 1/2020 | Seo et al. | |
| 2020/0027388 A1 | 1/2020 | Iwaki et al. | |
| 2020/0152612 A1* | 5/2020 | Chen | H01L 25/0753 |
| 2020/0302840 A1* | 9/2020 | Kim | G09G 3/3233 |
| 2020/0403028 A1 | 12/2020 | Kusunoki et al. | |
| 2021/0174734 A1 | 6/2021 | Takahashi et al. | |
| 2021/0328002 A1* | 10/2021 | Lee | H01L 27/3279 |
| 2021/0391309 A1* | 12/2021 | Kim | H01L 33/62 |
| 2022/0037405 A1* | 2/2022 | Ren | H01L 27/288 |
| 2022/0052032 A1* | 2/2022 | Li | H01L 25/0753 |

FOREIGN PATENT DOCUMENTS

| | | |
|---|---|---|
| JP | 2017-120412 A | 7/2017 |
| WO | WO-2008/006756 | 1/2008 |
| WO | WO-2019/130138 | 7/2019 |

\* cited by examiner

FUNCTIONAL PANEL, DISPLAY DEVICE, INPUT/OUTPUT DEVICE, AND DATA PROCESSING DEVICE

BACKGROUND OF THE INVENTION

1. Field of the Invention

One embodiment of the present invention relates to a functional panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A display using a micro light-emitting diode whose chromaticity changes little with respect to a current density is known (Patent Document 1). Specifically, a plurality of pixels each include a display element and a microcontroller. The microcontroller includes a first transistor, a triangular wave generation circuit, a comparator, a switch, and a constant current circuit. The first transistor has a function of retaining a potential corresponding to data written to the pixel by being turned off. The triangular wave generation circuit has a function of generating a triangular wave signal. The comparator has a function of generating an output signal corresponding to the retained potential and the triangular wave signal. The switch has a function of controlling, in accordance with the output signal, the supply of a current flowing through the constant current circuit to the display element.

REFERENCE

[Patent Document 1] PCT International Publication No. WO2019/130138

SUMMARY OF THE INVENTION

An object of one embodiment of the present invention is to provide a novel functional panel that is highly convenient, useful, or reliable. Another object is to provide a novel display device that is highly convenient, useful, or reliable. Another object is to provide a novel input/output device that is highly convenient, useful, or reliable. Another object is to provide a novel data processing device that is highly convenient, useful, or reliable. Another object is to provide a novel functional panel, a novel display device, a novel input/output device, a novel data processing device, or a novel semiconductor device.

Note that the descriptions of these objects do not preclude the existence of other objects. One embodiment of the present invention does not have to achieve all these objects. Other objects will be apparent from and can be derived from the descriptions of the specification, the drawings, the claims, and the like.

(1) One embodiment of the present invention is a functional panel including a light-emitting region, a first functional layer, and a second functional layer.

The light-emitting region includes a first element. The first element includes a first electrode, a second electrode, and a layer containing a light-emitting material. The layer containing a light-emitting material includes a region positioned between the first electrode and the second electrode, and contains gallium nitride.

The first functional layer includes a region positioned between the light-emitting region and the second functional layer, and includes a first insulating film. The first insulating film includes a first opening and a second opening on the outside of a portion where the first insulating film overlaps with the light-emitting region.

The second functional layer includes a driver circuit. The driver circuit includes a portion overlapping with the light-emitting region, and includes a first transistor and a second transistor. The first transistor is electrically connected to the first electrode through the first opening, and the second transistor is electrically connected to the second electrode through the second opening.

(2) Another embodiment of the present invention is a display panel including a pixel set and a first functional layer.

The pixel set includes a first pixel and a second pixel, the first pixel includes a first element, and the second pixel includes a second element.

The first functional layer includes a first insulating film and a second insulating film. The first insulating film includes a region where the first element is positioned between the first insulating film and the second insulating film, and the first insulating film includes a region where the second element is positioned between the first insulating film and the second insulating film. The second insulating film has a function of separating the second element from the first element.

The first element has a function of emitting light and includes a first electrode, a second electrode, and a layer containing a light-emitting material. The layer containing a light-emitting material includes a region positioned between the first electrode and the second electrode, and contains gallium nitride.

(3) Another embodiment of the present invention is the above functional panel further including a second functional layer. Note that the first insulating film includes a first opening and a second opening.

The second functional layer includes a third insulating film, a first driver circuit, and a second driver circuit. The third insulating film is in contact with the first insulating film and includes a third opening and a fourth opening.

The first driver circuit includes a first transistor and the first transistor is electrically connected to the first electrode through the first opening and the third opening. The second driver circuit includes a second transistor and the second transistor is electrically connected to the second electrode through the second opening and the fourth opening.

Consequently, the first pixel can be driven by the first driver circuit and the second driver circuit. The first element can be passively driven without a pixel circuit provided in the first pixel. The operation of the first element can be inhibited from influencing the operation of the second element. The second element can be positioned close to the first element. The area occupied by the first element in the first pixel and the area occupied by the second element in the second pixel can be increased. As a result, a novel functional panel that is highly convenient, useful, or reliable can be provided.

(4) Another embodiment of the present invention is the above functional panel in which the first insulating film includes a fourth insulating film and the fourth insulating film contains silicon and oxygen.

The second insulating film includes a fifth insulating film and a sixth insulating film, the fifth insulating film contains silicon and oxygen, and the fifth insulating film includes a region bonded to the fourth insulating film.

The sixth insulating film contains silicon and nitrogen and includes a region positioned between the fifth insulating film and the first transistor. The first transistor contains single crystal silicon.

Consequently, diffusion of impurities, which cause malfunction during the operation, can be inhibited. The first driver circuit can be positioned to overlap with the first pixel, for example. The outer size of the functional panel can be reduced. As a result, a novel functional panel that is highly convenient, useful, or reliable can be provided.

(5) Another embodiment of the present invention is the above functional panel in which the first pixel includes a color conversion layer. Note that the color conversion layer has a function of converting the color of light emitted from the first element into a different color.

The second pixel displays the color of light emitted from the second element and the second element emits light of the same color as the light emitted from the first element.

Consequently, the second element can be formed in the same step as the first element. The first pixel can display a color different from that of the second pixel. As a result, a novel functional panel that is highly convenient, useful, or reliable can be provided.

(6) Another embodiment of the present invention is the above functional panel further including a region.

The region includes a group of pixel sets, another group of pixel sets, a first conductive film, and a second conductive film.

The one group of pixel sets is arranged in a row direction, includes the above pixel set, and is electrically connected to the first conductive film.

The other group of pixel sets is arranged in a column direction intersecting the row direction, includes the above pixel set, and is electrically connected to the second conductive film.

Consequently, image data can be supplied to a plurality of pixels. As a result, a novel functional panel that is highly convenient, useful, or reliable can be provided.

(7) Another embodiment of the present invention is a display device including a control unit and the above functional panel.

The control unit is supplied with image data and control data, generates data on the basis of the image data, generates a control signal on the basis of the control data, and supplies the data and the control signal.

The functional panel is supplied with the data and the control signal, and the above pixel set performs display on the basis of the data.

Consequently, image data can be displayed using the functional panel. As a result, a novel display device that is highly convenient, useful, or reliable can be provided.

(8) Another embodiment of the present invention is an input/output device including an input unit and a display unit. Note that the display unit includes the above functional panel.

The input unit includes a sensing region and senses an object approaching the sensing region. The sensing region includes a region overlapping with the above pixel set.

Consequently, an object that approaches a region overlapping with the display unit can be sensed while image data is displayed using the display unit. A finger or the like that approaches the display unit can be used as a pointer to input positional data. Positional data can be associated with image data displayed on the display unit. As a result, a novel input/output device that is highly convenient, useful, or reliable can be provided.

(9) Another embodiment of the present invention is a data processing device including an arithmetic device and an input/output device.

The arithmetic device is supplied with input data or sensing data, generates control data and image data on the basis of the input data or the sensing data, and supplies the control data and the image data.

The input/output device supplies the input data and the sensing data, is supplied with the control data and the image data, and includes a display unit, an input unit, and a sensor unit.

The display unit includes the above functional panel and displays the image data on the basis of the control data. The input unit generates the input data. The sensor unit generates the sensing data.

Consequently, the control data can be generated on the basis of the input data or the sensing data. The image data can be displayed on the basis of the input data or the sensing data. As a result, a novel data processing device that is highly convenient, useful, or reliable can be provided.

(10) Another embodiment of the present invention is a data processing device including the above functional panel and at least one of a keyboard, a hardware button, a pointing device, a touch sensor, an illuminance sensor, an imaging device, an audio input device, an eye-gaze input device, and an attitude sensing device.

Consequently, the arithmetic device can generate image data or control data on the basis of data supplied using a variety of input devices. As a result, a novel data processing device that is highly convenient, useful, or reliable can be provided.

Although the block diagram attached to this specification shows components classified by their functions in independent blocks, it is difficult to classify actual components according to their functions completely, and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; in reality, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components, such as a case where part of a wiring serves as an electrode. The term "connection" in this specification also means such a case where one conductive film has functions of a plurality of components.

In this specification, one of a first electrode and a second electrode of a transistor refers to a source electrode and the other refers to a drain electrode.

According to one embodiment of the present invention, a novel functional panel that is highly convenient, useful, or reliable can be provided. A novel display device that is highly convenient, useful, or reliable can be provided. A novel input/output device that is highly convenient, useful, or reliable can be provided. A novel data processing device that is highly convenient, useful, or reliable can be provided. A novel functional panel, a novel display device, a novel input/output device, a novel data processing device, or a novel semiconductor device can be provided.

Note that the descriptions of these effects do not preclude the existence of other effects. One embodiment of the present invention does not necessarily have all these effects. Other effects will be apparent from and can be derived from the descriptions of the specification, the drawings, the claims, and the like.

DETAILED DESCRIPTION OF THE INVENTION

Figure 1A:
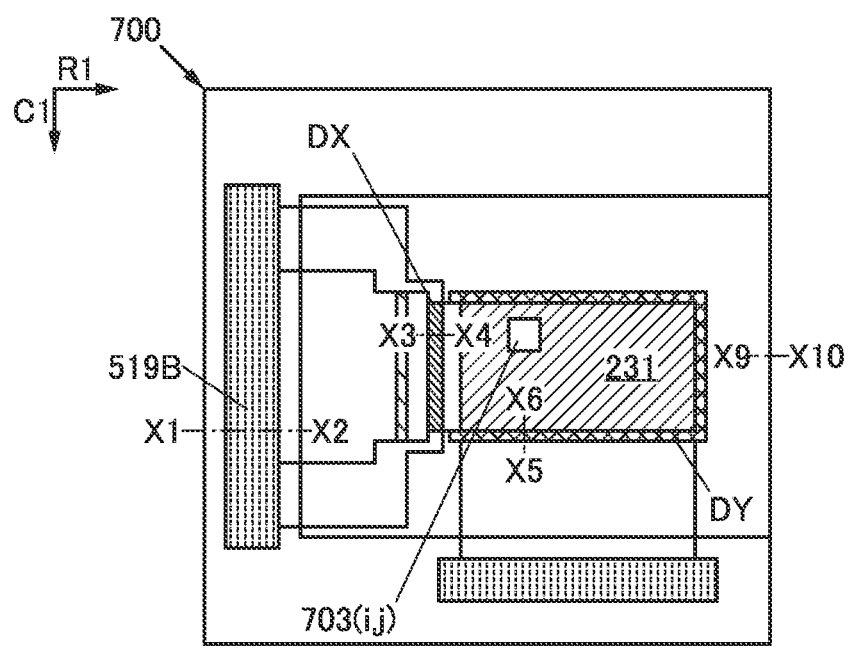
FIGS. 1A to 1C illustrate a structure of a functional panel of one embodiment.

The functional panel of one embodiment of the present invention includes a light-emitting region, a first functional layer, and a second functional layer. The light-emitting region includes a first element. The first element includes a first electrode, a second electrode, and a layer containing a light-emitting material. The layer containing a light-emitting material includes a region positioned between the first electrode and the second electrode, and contains gallium nitride. The first functional layer includes a region positioned between the light-emitting region and the second functional layer, and includes a first insulating film. The first insulating film includes a first opening and a second opening on the outside of a portion where the first insulating film overlaps with the light-emitting region. The second functional layer includes a driver circuit. The driver circuit includes a portion overlapping with the light-emitting region and includes a first transistor and a second transistor. The first transistor is electrically connected to the first electrode through the first opening, and the second transistor is electrically connected to the second electrode through the second opening.

Consequently, the first element can be passively driven without a pixel circuit provided in a pixel. The operation of the first element can be inhibited from influencing the operation of the second element adjacent to the first element. The second element can be positioned close to the first element. The area occupied by the first element in the first pixel and the area occupied by the second element in the second pixel can be increased. As a result, a novel functional panel that is highly convenient, useful, or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, structures of a functional panel of one embodiment of the present invention will be described with reference to FIGS. 1A to 1C, FIGS. 2A and 2B, FIG. 3, and FIGS. 4A and 4B.

Figure 1B:
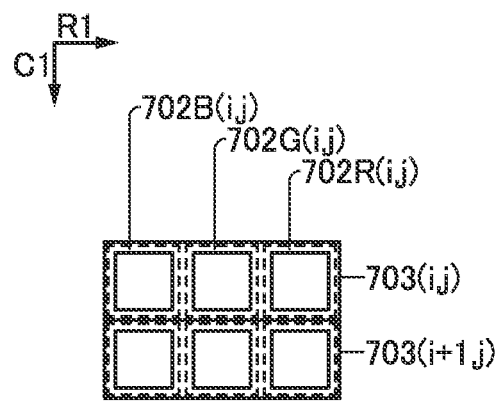
Figure 1C:
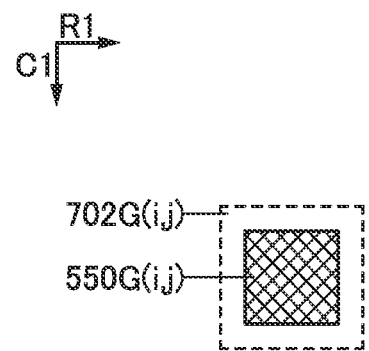

FIG. 1A is a top view illustrating a structure of the functional panel of one embodiment of the present invention, FIG. 1B illustrates part of FIG. 1A, and FIG. 1C illustrates part of FIG. 1B.

Figure 2A:
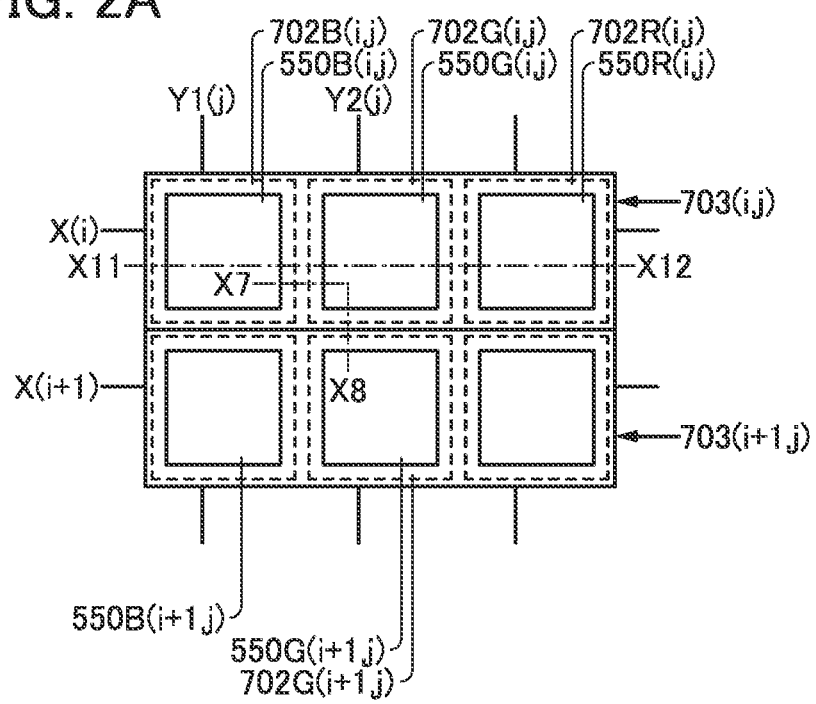
FIGS. 2A and 2B illustrate a structure of a functional panel of one embodiment.
Figure 2B:
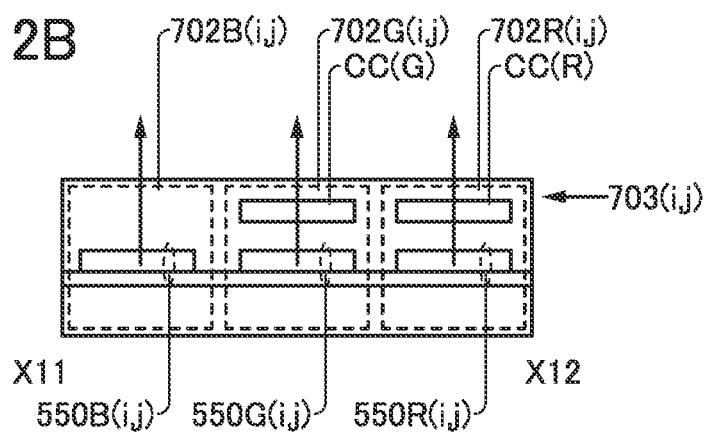

FIG. 2A is a top view illustrating a structure of the functional panel of one embodiment of the present invention, which is part of FIG. 1A. FIG. 2B is a cross-sectional view taken along the cutting line X11-X12 in FIG. 2A.

Figure 3:
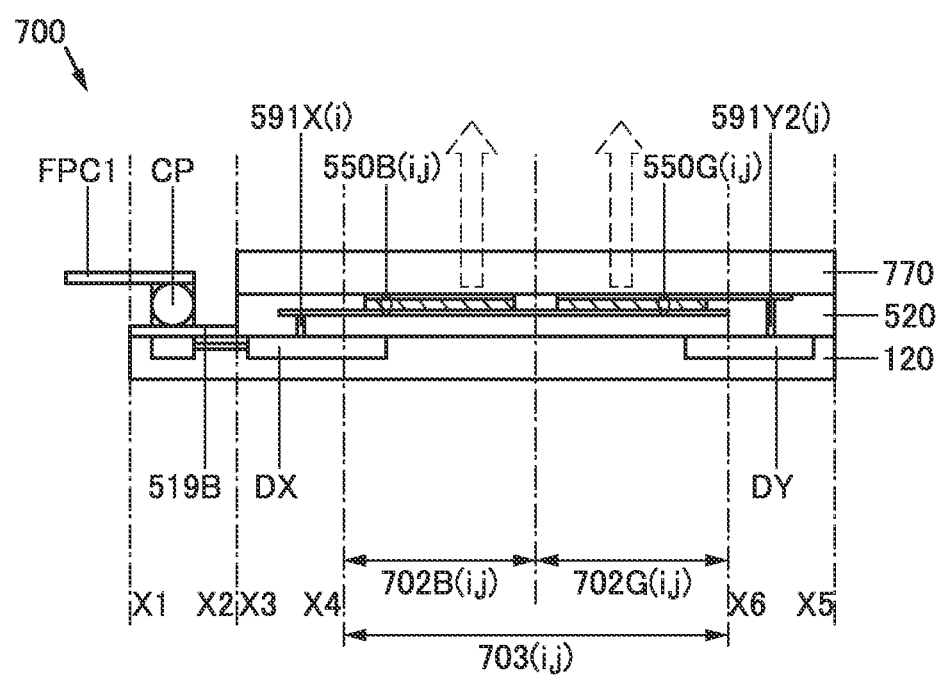
FIG. 3 is a cross-sectional view illustrating a structure of a functional panel of one embodiment.

FIG. 3 is a cross-sectional view illustrating a structure of the functional panel of one embodiment of the present invention, and illustrates a cross-section of a pixel set 703(i,j) and cross sections along the cutting lines X1-X2, X3-X4, and X5-X6 in FIG. 1A.

Figure 4A:
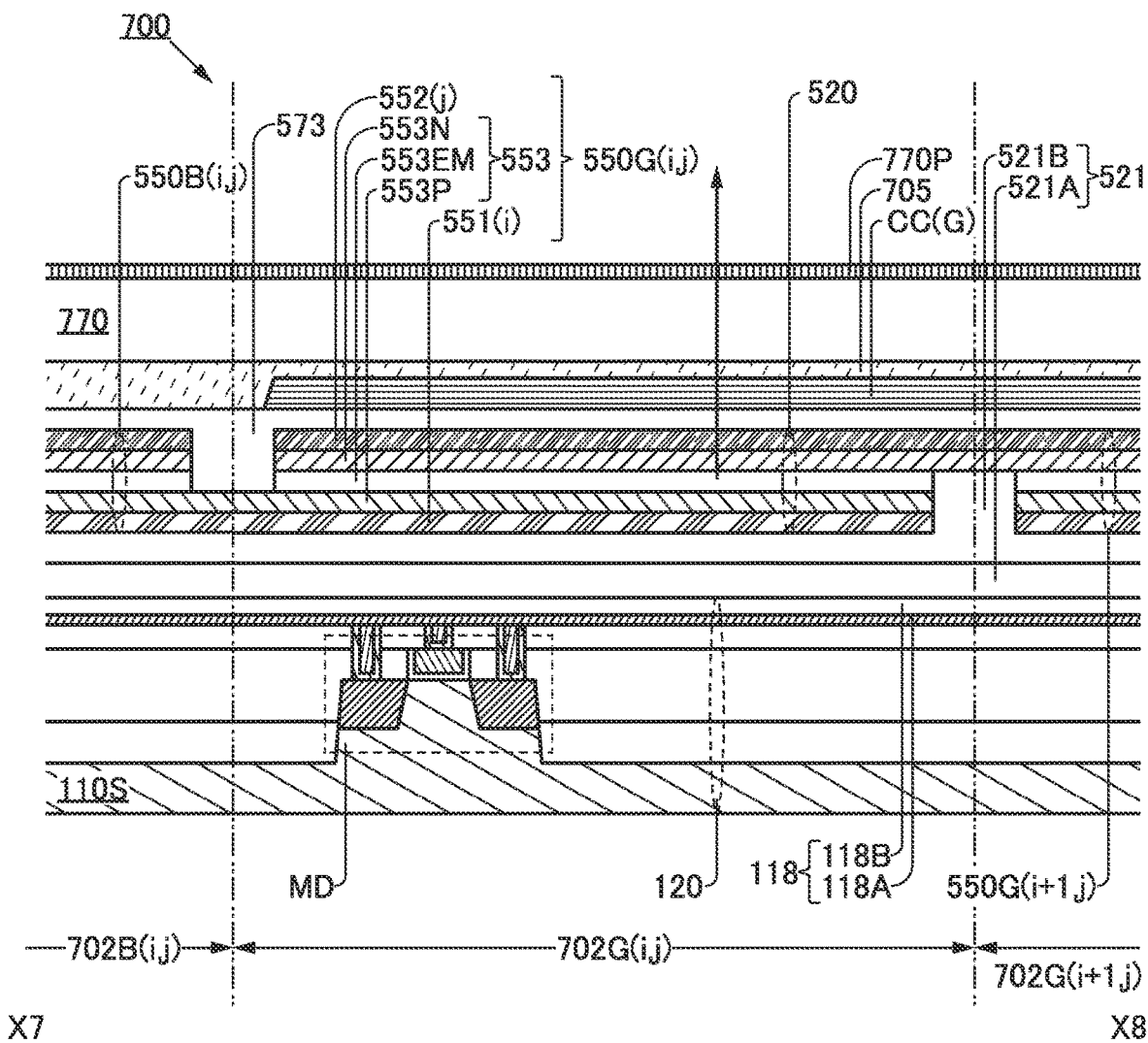
FIGS. 4A and 4B are cross-sectional views illustrating a structure of a functional panel of one embodiment.
Figure 4B:
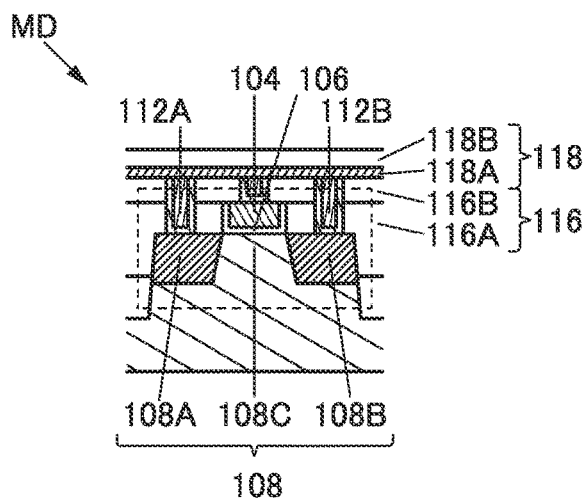

FIG. 4A illustrates a structure of the functional panel of one embodiment of the present invention, and is a cross-sectional view taken along the cutting line X7-X8 in FIG. 2A. FIG. 4B is a cross-sectional view illustrating part of FIG. 4A.

Figure 5A:
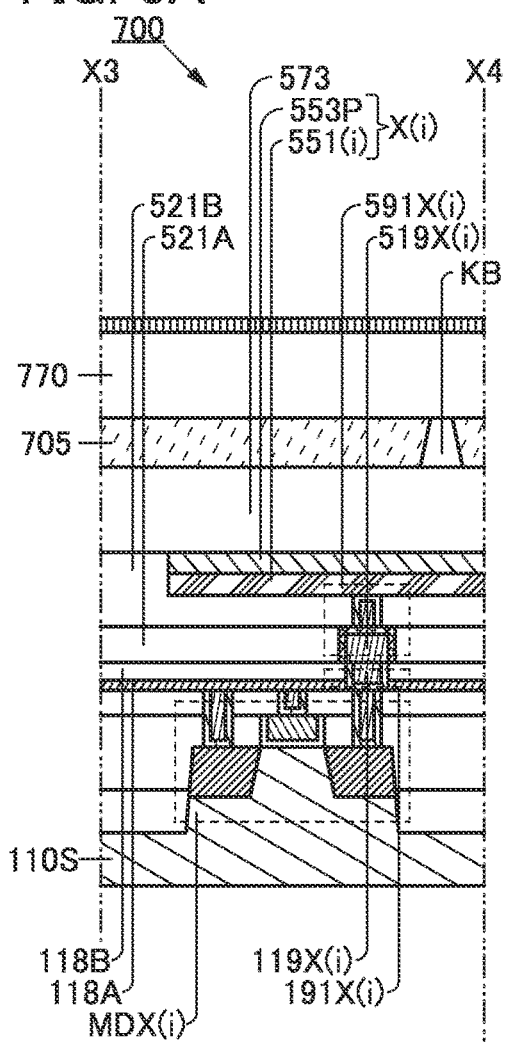
FIGS. 5A to 5C are cross-sectional views illustrating a structure of a functional panel of one embodiment.
Figure 5B:
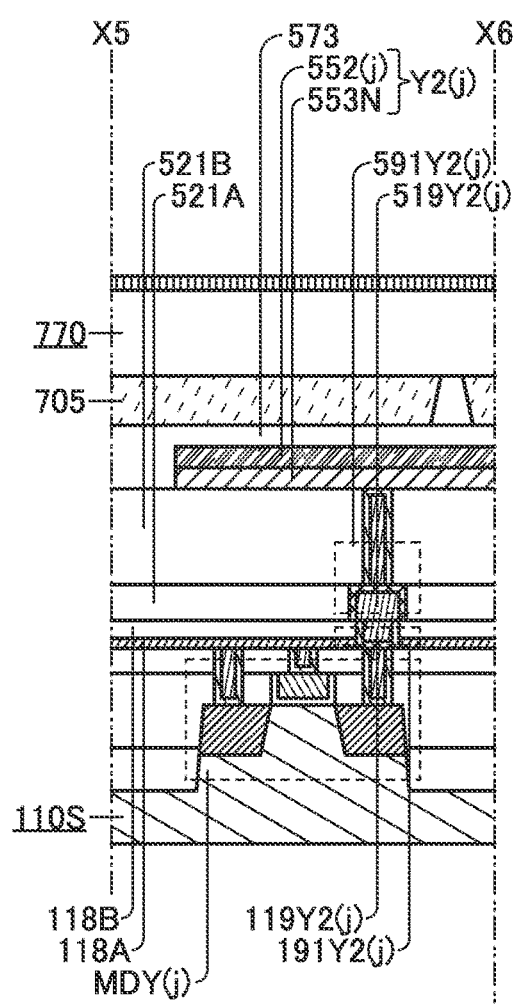
Figure 5C:
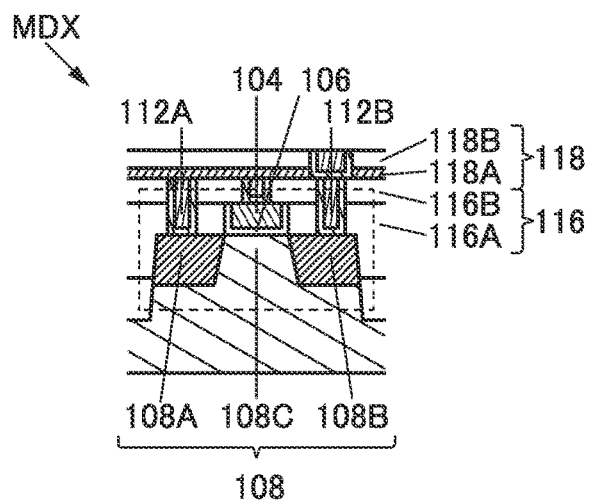

FIG. 5A illustrates a structure of the functional panel of one embodiment of the present invention, and is a cross-sectional view taken along the cutting line X3-X4 in FIG. 3. FIG. 5B is a cross-sectional view taken along the cutting line X5-X6 in FIG. 3. FIG. 5C is a cross-sectional view illustrating part of FIG. 5A.

Note that in this specification, an integer variable of 1 or more may be used for reference numerals. For example, "(p)" where p is an integer variable of 1 or more may be used for part of a reference numeral that specifies any one of components (p components at a maximum). For another example, "(m,n)" where each of m and n is an integer variable of 1 or more may be used for part of a reference numeral that specifies any one of components (m×n components at a maximum).

<Structure Example of Functional Panel 700>

A functional panel 700 described in this embodiment includes a pixel set 703(i,j) (see FIGS. 1A and 1B and FIG. 2A). The functional panel 700 includes a functional layer 520 and a functional layer 120 (see FIG. 3). The functional panel 700 also includes a pixel set 703(i+1,j).

<<Structure Example of Pixel Set 703(i,j)>>

The pixel set 703(i,j) includes a pixel 702G(i,j), a pixel 702B(i,j), and a pixel 702R(i,j) (see FIG. 2A). The pixel set 703(i+1,j) includes an element 550G(i+1,j).

The pixel 702G(i,j) includes an element 550G(i,j), the pixel 702B(i,j) includes an element 550B(i,j), and the pixel 702R(i,j) includes an element 550R(i,j). For example, the pixel 702G(i,j), the pixel 702B(i,j), and the pixel 702R(i,j) have functions of displaying green, blue, and red, respectively. Note that the element 550G(i,j) can be actively driven when a pixel circuit is provided in the pixel 702G(i,j). For example, a transistor can be formed in the functional layer 520 so as to be used in a pixel circuit. Alternatively, the transistor can be electrically connected to the element 550G(i,j).

<<Structure Example of Functional Layer 520>>

The functional layer 520 includes an insulating film 521 and an insulating film 573 (see FIG. 3 and FIG. 4A).

The insulating film 521 includes a region where the element 550G(i,j) is positioned between the insulating film 521 and the insulating film 573, and a region where the element 550B(i,j) is positioned between the insulating film 521 and the insulating film 573. The insulating film 521 also includes an opening 591X(i) and an opening 591Y2(j) (see FIGS. 5A and 5B).

The insulating film 573 has a function of separating the element 550B(i,j) from the element 550G(i,j) (see FIG. 4A).

<<Structure Example of Element 550G(i,j)>>

The element 550G(i,j) has a function of emitting light, and includes an electrode 551(i), an electrode 552(j), and a layer 553 containing a light-emitting material.

The layer 553 containing a light-emitting material includes a region positioned between the electrode 551(i) and the electrode 552(j), and contains gallium nitride.

For example, a mini-LED can be used as the element 550G(i,j). Specifically, a mini-LED whose light-emitting region has an area of 1 mm$^2$ or less, preferably 50000 μm$^2$ or less, further preferably 30000 μm$^2$ or less, still further preferably 10000 μm$^2$ or less and 200 μm$^2$ or more can be used as the element 550G(i,j).

Alternatively, a micro LED can be used as the element 550G(i,j). Specifically, a micro LED whose light-emitting region has an area of less than 200 μm$^2$, preferably 60 μm$^2$ or less, further preferably 15 μm$^2$ or less, still further preferably 5 μm$^2$ or less and 3 μm$^2$ or more can be used as the element 550G(i,j).

[Structure Example 1 of Layer 553 Containing Light-Emitting Material]

The element 550G(i,j) includes a p-type clad layer 553P, an n-type clad layer 553N, and a light-emitting layer 553EM, for example. The light-emitting layer 553EM includes a region positioned between the p-type clad layer 553P and the n-type clad layer 553N. This allows carrier recombination in the light-emitting layer 553EM, resulting in light emission.

For example, a layered material for emitting blue light, green light, or red light can be used for the pixel. Specifically, a compound of gallium and phosphorus, a compound of gallium and arsenic, a compound of gallium, aluminum, and arsenic, a compound of aluminum, gallium, indium, and phosphorus, a compound of indium and gallium nitride, or the like can be used for the pixel.

In particular, an element emitting blue light can be used as the element 550G(i,j) and the element 550B(i,j). Thus, the element 550G(i,j) and the element 550B(i,j) can be formed in the same step.

Alternatively, an element emitting ultraviolet rays can be used as the element 550G(i,j) and the element 550B(i,j). A color conversion layer can be provided so as to overlap with the element 550B(i,j) to convert the ultraviolet rays into blue light.

<<Structure Example of Functional Layer 120>>

The functional layer 120 includes an insulating film 118, a driver circuit DX, and a driver circuit DY (see FIG. 3). The functional layer 120 also includes an insulating film 116.

The insulating film 118 is in contact with the insulating film 521, and the insulating film 118 includes an opening 191X(i) and an opening 191Y2(j) (see FIG. 4A and FIGS. 5A and 5B).

The driver circuit DX includes a transistor MDX(i) and the transistor MDX(i) is electrically connected to the electrode 551(i) through the opening 591X(i) and the opening 191X(i) (see FIG. 5A). Note that the driver circuit DX has a function of selecting one of a plurality of electrodes and supplying a predetermined voltage thereto. For example, the electrode 551(i) is selected and supplied with a voltage higher than that supplied to the electrode 552(j).

For example, a contact 119X(i) is electrically connected to a contact 519X(i) and the contact 519X(i) is electrically connected to the electrode 551(i). A contact 119Y2(j) is electrically connected to a contact 519Y2(j) and the contact 519Y2(j) is electrically connected to the electrode 552(j) through the n-type clad layer 553N.

For example, a metal can be used for the contact 119X(i), the contact 519X(i), the contact 119Y2(j), and the contact 519Y2(j). Specifically, copper, gold, or the like can be used.

The driver circuit DY includes a transistor MDY(j) and the transistor MDY(j) is electrically connected to the electrode 552(j) through the opening 591Y2(j) and the opening 191Y2(j) (see FIG. 5B). Note that the driver circuit DY has a function of selecting one of a plurality of electrodes and supplying a predetermined voltage thereto. For example, the electrode 552(j) is selected and supplied with a voltage lower than that supplied to the electrode 551(i).

Thus, the pixel 702G(i,j) can be driven by the driver circuit DX and the driver circuit DY. The element 550G(i,j) can be passively driven without a pixel circuit provided in the pixel 702G(i,j). The operation of the element 550G(i,j) can be inhibited from influencing the operation of the element 550B(i,j). The element 550B(i,j) can be positioned close to the element 550G(i,j). The area occupied by the element 550G(i,j) in the pixel 702G(i,j) can be increased. The area occupied by the element 550B(i,j) in the pixel 702B(i,j) can be increased. As a result, a novel functional panel that is highly convenient, useful, or reliable can be provided.

<<Structure Example of Insulating Film>>

The insulating film 521 includes an insulating film 521A and an insulating film 521B, and the insulating film 521A contains silicon and oxygen (see FIGS. 5A and 5B).

The insulating film 118 includes an insulating film 118A and an insulating film 118B. The insulating film 116 includes an insulating film 116A and an insulating film 116B.

The insulating film 118B contains silicon and oxygen and includes a region bonded to the insulating film 521A. Thus, the insulating film 118B and the insulating film 521A can be bonded to each other by a surface activated bonding method, for example. Alternatively, the functional layer 520 and the functional layer 120 can be attached to each other.

The insulating film 118A contains silicon and nitrogen and includes a region positioned between the insulating film 118B and the transistor MDX(i) (see FIG. 5A).

<<Structure Example of Transistor>>

The transistor MDX(i) contains single crystal silicon. In the step of forming the transistor MDX(i), the transistor MDY(j) and a transistor MD can be formed (see FIG. 4B and FIG. 5B). For example, a single crystal silicon substrate can be used as a base 110S on which the transistor can be formed. Thus, the transistor MD can be used in the driver circuit and the like (see FIG. 4A).

The transistor MDX(i) includes a semiconductor film 108, a conductive film 104, a conductive film 112A, and a conductive film 112B (see FIG. 5C).

The semiconductor film 108 includes a region 108A electrically connected to the conductive film 112A and a region 108B electrically connected to the conductive film 112B. The semiconductor film 108 includes a region 108C between the region 108A and the region 108B.

The conductive film 104 includes a region overlapping with the region 108C and has a function of a gate electrode.

An insulating film 106 includes a region positioned between the semiconductor film 108 and the conductive film 104. The insulating film 106 has a function of a gate insulating film.

The conductive film 112A has one of a function of a source electrode and a function of a drain electrode, and the conductive film 112B has the other.

Consequently, diffusion of impurities, which cause malfunction during the operation, into the transistor MDX(i) can be inhibited. The driver circuit DX can be positioned to overlap with the pixel 702G(i,j), for example. The outer size of the functional panel can be reduced. As a result, a novel functional panel that is highly convenient, useful, or reliable can be provided.

<<Structure Example 1 of Semiconductor Film 108>>

For example, a semiconductor containing a Group 14 element can be used for the semiconductor film 108. Specifically, a semiconductor containing silicon can be used for the semiconductor film 108.

[Hydrogenated Amorphous Silicon]

For example, hydrogenated amorphous silicon can be used for the semiconductor film 108. Microcrystalline silicon or the like can also be used for the semiconductor film 108. Thus, it is possible to provide a functional panel having less display unevenness than a functional panel using polysilicon for the semiconductor film 108, for example. The size of the functional panel can be easily increased.

[Polysilicon]

For example, polysilicon can be used for the semiconductor film 108. In this case, for example, the field-effect mobility of the transistor can be higher than that of a transistor using hydrogenated amorphous silicon for the semiconductor film 108. For another example, the driving capability can be higher than that of a transistor using hydrogenated amorphous silicon for the semiconductor film 108. For another example, the aperture ratio of the pixel can be higher than that of a transistor using hydrogenated amorphous silicon for the semiconductor film 108.

For another example, the reliability of the transistor can be higher than that of a transistor using hydrogenated amorphous silicon for the semiconductor film 108.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over a substrate where the pixel circuit is formed. The number of components included in an electronic device can be reduced.

[Single Crystal Silicon]

For example, single crystal silicon can be used for the semiconductor film 108. In this case, for example, the resolution can be higher than that of a functional panel using hydrogenated amorphous silicon for the semiconductor film 108. It is also possible to provide a functional panel having less display unevenness than a functional panel using polysilicon for the semiconductor film 108, for example. For another example, smart glasses or a head mounted display can be provided.

<<Structure Example 2 of Semiconductor Film 108>>

For example, a metal oxide can be used for the semiconductor film 108. In this case, the pixel circuit can hold an image signal for a longer time than a pixel circuit including a transistor that uses amorphous silicon for the semiconductor film. Specifically, a selection signal can be supplied at a frequency of lower than 30 Hz, preferably lower than 1 Hz, further preferably less than once per minute while flickering is suppressed. Consequently, fatigue of a user of the data processing device can be reduced. Furthermore, power consumption for driving can be reduced.

For example, a transistor including an oxide semiconductor can be used. Specifically, an oxide semiconductor containing indium, an oxide semiconductor containing indium, gallium, and zinc, or an oxide semiconductor containing indium, gallium, zinc, and tin can be used for the semiconductor film.

For example, a transistor having a lower leakage current in an off state than a transistor using amorphous silicon for a semiconductor film can be used. Specifically, a transistor using an oxide semiconductor for a semiconductor film can be used as a switch or the like. In that case, the potential of a floating node can be held for a longer time than in a circuit in which a transistor using amorphous silicon is used as a switch.

Thus, flicker of display can be suppressed. Power consumption can be reduced. A moving image that moves fast can be displayed smoothly. A photograph and the like can be displayed in a large number of gray levels. As a result, a novel functional panel that is highly convenient, useful, or reliable can be provided.

<<Structure Example 3 of Semiconductor Film 108>>

For example, a compound semiconductor can be used as a semiconductor of the transistor. Specifically, a semiconductor containing gallium arsenide can be used.

For example, an organic semiconductor can be used as a semiconductor of the transistor. Specifically, an organic semiconductor containing any of polyacenes or graphene can be used for the semiconductor film.

<<Structure Example of Pixel>>

The pixel 702G(i,j) includes a color conversion layer CC(G) (see FIG. 4A).

The color conversion layer CC(G) has a function of converting the color of light emitted from the element 550G(i,j) into a different color.

The pixel 702B(i,j) displays the color of light emitted from the element 550B(i,j). Note that the element 550B(i,j) emits light of the same color as the light emitted from the element 550G(i,j).

<<Color Conversion Layer>>

The color conversion layer CC(G) includes a region positioned between the base 770 and the element 550G(i,j).

For example, a material that emits light with a wavelength longer than that of incident light can be used for the color conversion layer. For example, a material that absorbs blue light or ultraviolet rays and emits green light by conversion; a material that absorbs blue light or ultraviolet rays and emits red light by conversion; or a material that absorbs ultraviolet rays and emits blue light by conversion, can be used for the color conversion layer. For example, a phosphor can be used for the color conversion layer. Specifically, a quantum dot with a diameter of several nanometers can be used for the color conversion layer. Thus, light with a narrow spectral half-width can be emitted. Alternatively, light with high saturation can be emitted.

For example, the pixel 702G(i,j) includes the color conversion layer CC(G) and the element 550G(i,j), the element 550G(i,j) emits blue light, and the color conversion layer CC(G) converts blue light into green light (see FIG. 2B). The pixel 702R(i,j) includes a color conversion layer CC(R) and the element 550R(i,j), the element 550R(i,j) emits blue light, and the color conversion layer CC(R) converts blue light into red light. The pixel 702B(i,j) includes the element 550B(i,j) and the element 550B(i,j) emits blue light.

Thus, the element 550G(i,j), the element 550R(i,j), and the element 550B(i,j) can be formed in the same step. In addition, a variety of colors can be displayed by the pixel set 703(i,j).

Thus, the element 550B(i,j) and the element 550G(i,j) can be formed in the same step. A color different from that displayed by the pixel 702B(i,j) can be displayed by the pixel 702G(i,j). As a result, a novel functional panel that is highly convenient, useful, or reliable can be provided.

<Structure Example of Functional Panel 700>

The functional panel 700 includes the base 110S, the base 770, and a sealant 705 (see FIG. 4A). The functional panel 700 also includes a component KB.

<<Component KB>>

The component KB includes a region positioned between the functional layer 520 and the base 770 (see FIG. 5A). The component KB has a function of providing a certain space between the functional layer 520 and the base 770.

<<Functional Film 770P and the Like>>

A functional film 770P includes a region overlapping with the element 550G(i,j) (see FIG. 4A).

For example, an anti-reflection film, a polarizing film, a retardation film, a light diffusion film, a condensing film, or the like can be used as the functional film 770P.

For example, an anti-reflection film with a thickness of 1 µm or less can be used as the functional film 770P. Specifically, a stacked-layer film in which three or more, preferably five or more, further preferably 15 or more dielectrics are stacked can be used as the functional film 770P. This allows the reflectivity to be as low as 0.5% or less, preferably 0.08% or less.

For example, a circularly polarizing film can be used as the functional film 770P.

Furthermore, an antistatic film inhibiting the attachment of dust, a water repellent film preventing stains, an oil repellent film preventing stains, an anti-reflection film, an anti-glare (non-glare) film, a hard coat film inhibiting a scratch in use, a self-healing film that self-heals from scratches, or the like can be used as the functional film 770P.

For example, a terminal 519B can be electrically connected to a flexible printed circuit FPC1 with the use of a conductive material (see FIG. 3). Specifically, the terminal 519B can be electrically connected to the flexible printed circuit FPC1 with the use of a conductive material CP.

Note that this embodiment can be combined with any of the other embodiments in this specification as appropriate.

Embodiment 2

In this embodiment, a structure of the functional panel of one embodiment of the present invention will be described with reference to FIG. 6.

Figure 6:
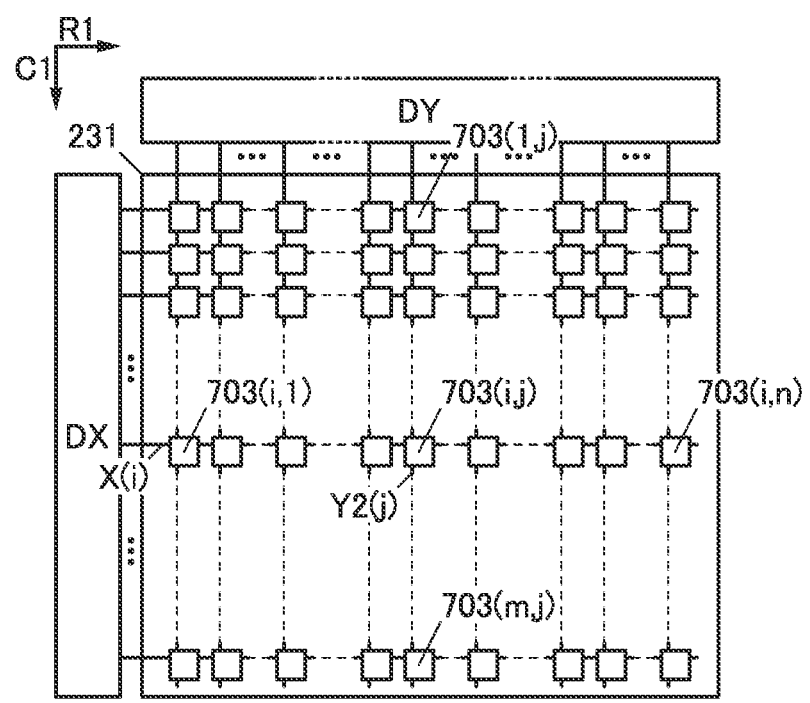
FIG. 6 illustrates a structure of a functional panel of one embodiment.

FIG. 6 is a block diagram illustrating a structure of the functional panel of one embodiment of the present invention.

<Structure Example of Functional Panel 700>

The functional panel 700 described in this embodiment includes a region 231 (see FIG. 6).

<<Structure Example 1 of Region 231>>

The region 231 includes a group of pixel sets 703(i, 1) to 703(i,n), another group of pixel sets 703(1,j) to 703(m,j), a conductive film X(i), and a conductive film Y2(j). Note that a stacked film of the electrode 551(i) and the p-type clad layer 553P can be used as the conductive film X(i) (see FIG. 5A). A stacked film of the electrode 552(j) and the n-type clad layer 553N can be used as the conductive film Y2(j) (see FIG. 5B). The region 231 includes a conductive film X(i+1) and a conductive film Y1(j) (see FIG. 2A).

The group of pixel sets 703(i,1) to 703(i,n) is arranged in the row direction (the direction indicated by an arrow R1 in FIG. 6) and includes the pixel set 703(i,j). The group of pixel sets is electrically connected to the conductive film X(i).

Another group of pixel sets 703(1,j) to 703(m,j) is arranged in the column direction intersecting the row direction (the direction indicated by an arrow C1 in FIG. 6) and includes the pixel set 703(*i,j*). The other group of pixel sets 703(1,*j*) to 703(*m,j*) is electrically connected to the conductive film Y2(*j*).

Thus, image data can be supplied to a plurality of pixels. As a result, a novel functional panel that is highly convenient, useful, or reliable can be provided.

<<Structure Example 2 of Region 231>>

The region 231 includes 600 or more pixel sets per inch, for example. Note that the plurality of pixel sets include the pixel set 703(*i,j*). The region 231 preferably includes 1000 or more pixel sets, further preferably 3000 or more pixel sets, still further preferably 6000 or more pixel sets per inch. This can reduce the screen-door effect, for example.

<<Structure Example 3 of Region 231>>

The region 231 includes a plurality of pixels in a matrix. For example, the region 231 includes 7600 or more pixels in the row direction and 4300 or more pixels in the column direction. Specifically, the region 231 includes 7680 pixels in the row direction and 4320 pixels in the column direction.

Consequently, a high-definition image can be displayed. As a result, a novel functional panel that is highly convenient or reliable can be provided.

Note that this embodiment can be combined with any of the other embodiments in this specification as appropriate.

Embodiment 3

In this embodiment, a structure of a display device of one embodiment of the present invention will be described with reference to FIGS. 7A to 7D.

Figure 7A:
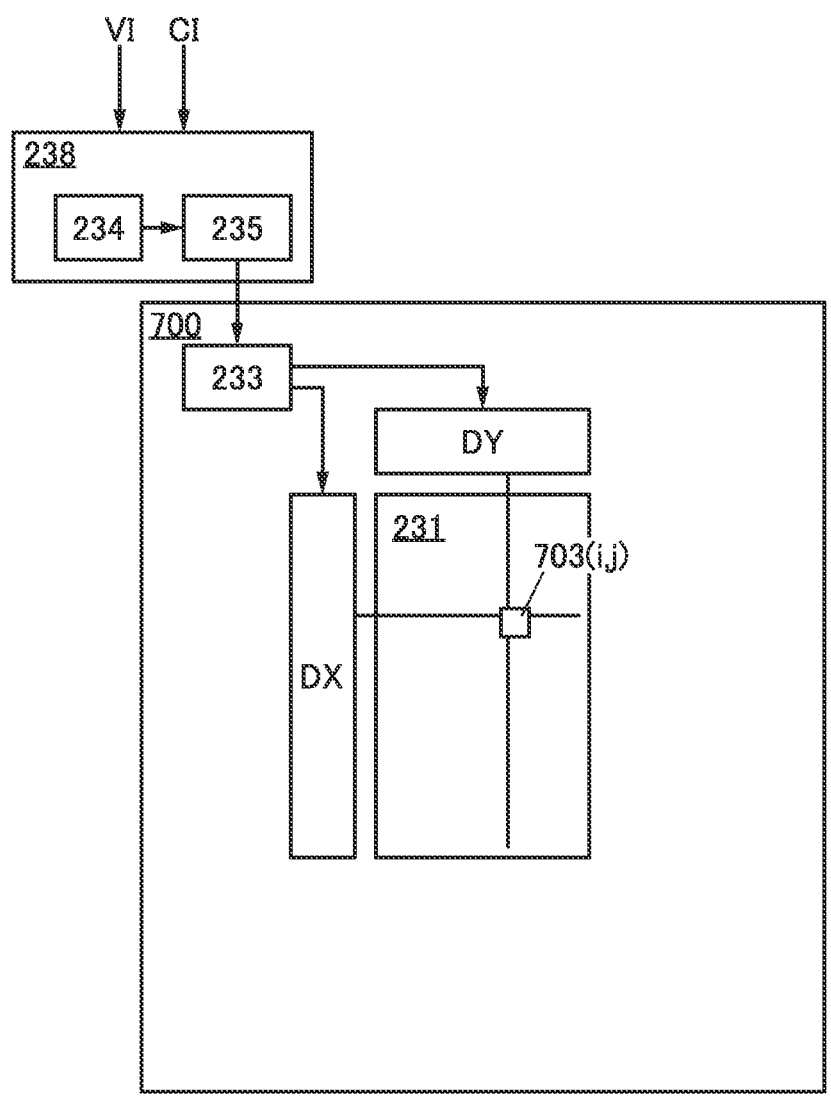
FIGS. 7A to 7D each illustrate a structure of a display device of one embodiment.
Figure 7B:
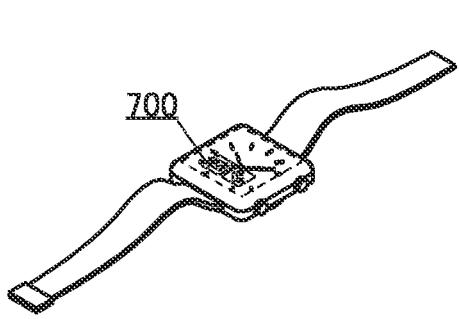
Figure 7C:
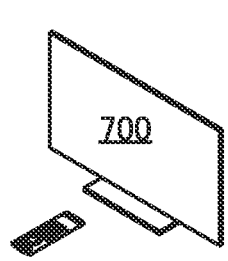
Figure 7D:
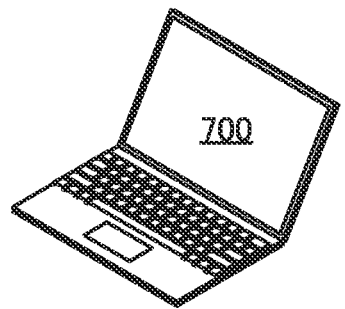

FIG. 7A is a block diagram of a display device of one embodiment of the present invention, and FIGS. 7B to 7D are perspective views each illustrating the appearance of a display device of one embodiment of the present invention.

<Structure Example of Display Device>

The display device described in this embodiment includes a control unit 238 and the functional panel 700 (see FIG. 7A).

<<Structure Example 1 of Control Unit 238>>

The control unit 238 receives image data VI and control data CI. For example, a clock signal, a timing signal, or the like can be used as the control data CI.

The control unit 238 generates data on the basis of the image data VI and generates a control signal on the basis of the control data CI. Moreover, the control unit 238 supplies the data and the control signal.

For example, the data includes gray levels of 8 bits or more, preferably 12 bits or more. The control signal can be, for example, a clock signal, a start pulse, or the like of a shift register used in a driver circuit.

<<Structure Example 2 of Control Unit 238>>

For example, a decompression circuit 234 and an image processing circuit 235 can be used in the control unit 238.

<<Decompression Circuit 234>>

The decompression circuit 234 has a function of decompressing the image data VI that is supplied in a compressed state. The decompression circuit 234 includes a memory unit. The memory unit has a function of storing decompressed image data, for example.

<<Image Processing Circuit 235>>

The image processing circuit 235 includes a memory region, for example. The memory region has a function of storing data contained in the image data VI, for example.

The image processing circuit 235 has a function of generating data by correcting the image data VI on the basis of a predetermined characteristics curve and a function of supplying the data, for example.

<<Structure Example 1 of Functional Panel 700>>

The functional panel 700 receives the data and the control signal, and the pixel set 703(*i,j*) performs display on the basis of the data. For example, the functional panel 700 described in Embodiment 1 or 2 can be used.

Thus, the image data VI can be displayed using the functional panel 700. As a result, a novel display device that is highly convenient, useful, or reliable can be provided. For example, an information terminal (see FIG. 7B), a video display system (see FIG. 7C), or a computer (see FIG. 7D) can be provided.

<<Structure Example 2 of Functional Panel 700>>

For example, the functional panel 700 includes driver circuits and control circuits.

<<Driver Circuit>>

The driver circuit operates on the basis of the control signal. The use of the control signal enables a plurality of driver circuits to operate in synchronization with each other (see FIG. 7A).

For example, the driver circuit DX can be used in the functional panel 700. The driver circuit DX has a function of receiving the control signal and supplying a first selection signal.

For example, the driver circuit DY can be used in the functional panel 700. The driver circuit DY can receive the control signal and the data and supply an image signal.

<<Control Circuit>>

A control circuit has a function of generating and supplying the control signal. For example, a clock signal, a timing signal, or the like can be used as the control signal.

For example, the control circuit can be provided in the functional layer 120. Specifically, a single crystal silicon substrate where a driver circuit and a control circuit are formed can be used in the functional layer 120. This allows the control circuit as well as the driver circuit to be positioned to overlap with the region 231. The number of components can be reduced. The outer size of the display device can be reduced.

Alternatively, a control circuit formed over a rigid substrate can be used in the functional panel. Alternatively, a control circuit formed over a rigid substrate can be electrically connected to the control unit 238 with the use of a flexible printed circuit.

A timing controller 233 can be used as the control circuit, for example.

Note that this embodiment can be combined with any of the other embodiments in this specification as appropriate.

Embodiment 4

In this embodiment, a structure of an input/output device of one embodiment of the present invention will be described with reference to FIG. 8.

Figure 8:
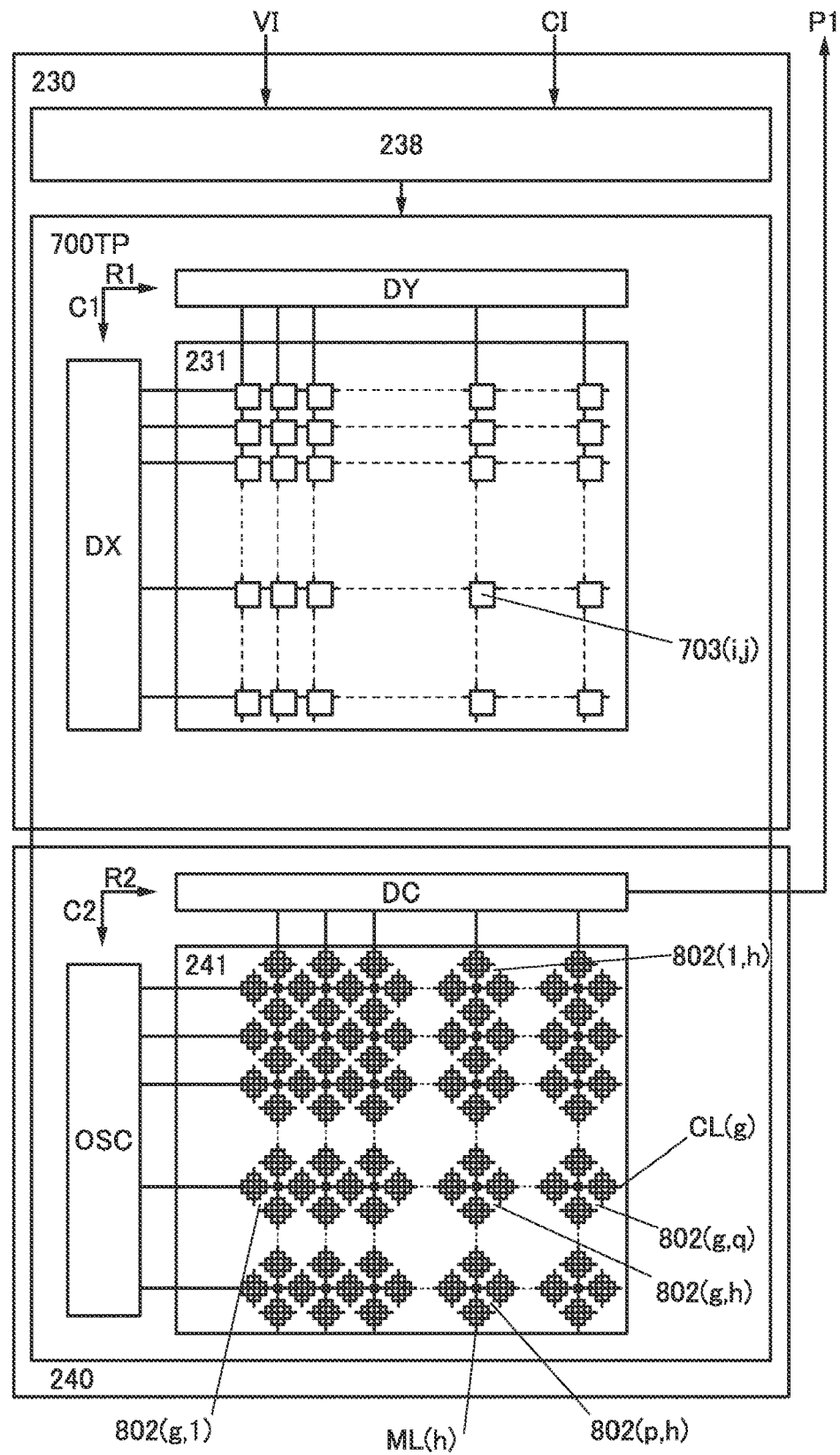
FIG. 8 is a block diagram illustrating a structure of an input/output device of one embodiment.

FIG. 8 is a block diagram illustrating a structure of an input/output device of one embodiment of the present invention.

<Structure Example of Input/Output Device>

The input/output device described in this embodiment includes an input unit 240 and a display unit 230 (see FIG. 8).

<<Structure Example of Display Unit 230>>

The display unit 230 includes the functional panel 700. For example, the functional panel 700 described in Embodiment 1 or 2 can be used in the display unit 230. Note that a panel including the input unit 240 and the display unit 230 can be referred to as a functional panel 700TP.

<<Structure Example 1 of Input Unit 240>>

The input unit 240 includes a sensing region 241. The input unit 240 senses an object approaching the sensing region 241.

The sensing region 241 includes a region overlapping with the pixel set 703(i,j).

Accordingly, an object that approaches the region overlapping with the display unit 230 can be sensed while image data is displayed using the display unit 230. A finger or the like that approaches the display unit 230 can be used as a pointer to input positional data. Positional data can be associated with image data displayed on the display unit 230. As a result, a novel input/output device that is highly convenient, useful, or reliable can be provided.

<<Structure Example of Sensing Region 241>>

The sensing region 241 includes one or more sensors, for example.

The sensing region 241 includes a group of sensors $802(g,1)$ to $802(g,q)$ and another group of sensors $802(1,h)$ to $802(p,h)$. Note that g is an integer greater than or equal to 1 and less than or equal to p, h is an integer greater than or equal to 1 and less than or equal to q, and each of p and q is an integer greater than or equal to 1.

The group of sensors $802(g,1)$ to $802(g,q)$ includes a sensor $802(g,h)$, is arranged in the row direction (the direction indicated by an arrow R2 in FIG. 8), and is electrically connected to a wiring CL(g). Note that the direction indicated by the arrow R2 may be the same as or different from the direction indicated by the arrow R1.

Another group of sensors $802(1,h)$ to $802(p,h)$ includes the sensor $802(g,h)$, is arranged in the column direction (the direction indicated by the arrow C2 in FIG. 8) intersecting the row direction, and is electrically connected to a wiring ML(h).

<<Sensor>>

The sensor has a function of sensing an approaching pointer. For example, a finger or a stylus pen can be used as the pointer. For example, a piece of metal or a coil can be used as the stylus pen.

Specifically, a capacitive proximity sensor, an electromagnetic inductive proximity sensor, an optical proximity sensor, a resistive proximity sensor, or the like can be used as the sensor.

A plurality of kinds of sensors can be used in combination. For example, a sensor that senses a finger and a sensor that senses a stylus pen can be used in combination.

Accordingly, the kind of a pointer can be identified. A different instruction can be associated with sensing data on the basis of the kind of the identified pointer. Specifically, when a finger is identified as being used as the pointer, sensing data can be associated with a gesture. Meanwhile, when a stylus pen is identified as being used as the pointer, sensing data can be associated with drawing processing.

Specifically, a finger can be sensed using a capacitive, pressure-sensitive, or optical proximity sensor. A stylus pen can be sensed using an electromagnetic inductive or optical proximity sensor.

<<Structure Example 2 of Input Unit 240>>

The input unit 240 includes an oscillator circuit OSC and a sensor circuit DC (see FIG. 8).

The oscillator circuit OSC supplies a search signal to the sensor $802(g,h)$. For example, a rectangular wave, a sawtooth wave, a triangular wave, or a sine wave can be used as the search signal.

The sensor $802(g,h)$ generates and supplies a sensing signal that changes in accordance with the search signal and the distance to a pointer approaching the sensor $802(g,h)$.

The sensor circuit DC supplies input data in accordance with the sensing signal.

Accordingly, the distance from an approaching pointer to the sensing region 241 can be sensed. The position in the sensing region 241 where the pointer comes the closest can be sensed.

Note that this embodiment can be combined with any of the other embodiments in this specification as appropriate.

Embodiment 5

In this embodiment, a structure of a data processing device of one embodiment of the present invention will be described with reference to FIGS. 9A to 9C.

Figure 9A:
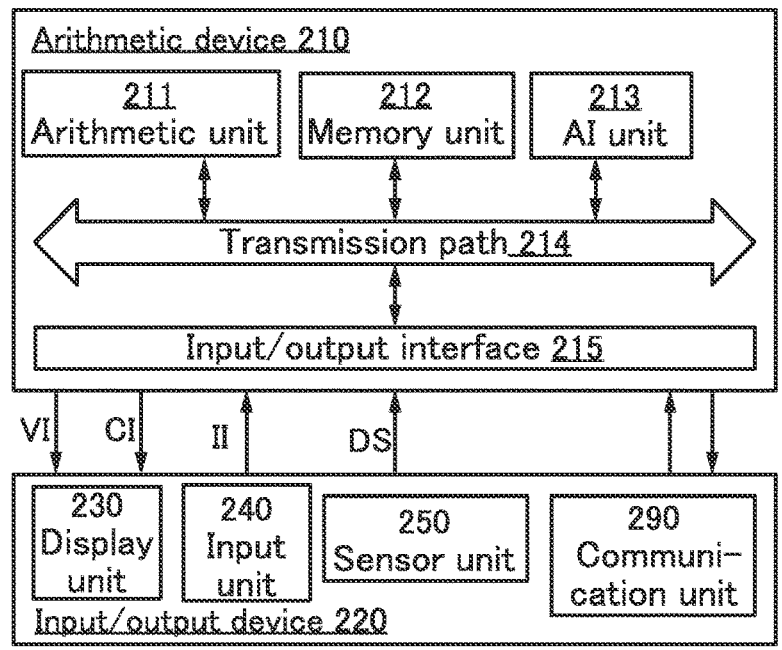
FIGS. 9A to 9C are a block diagram and projection views illustrating structures of data processing devices of embodiments.
Figure 9B:
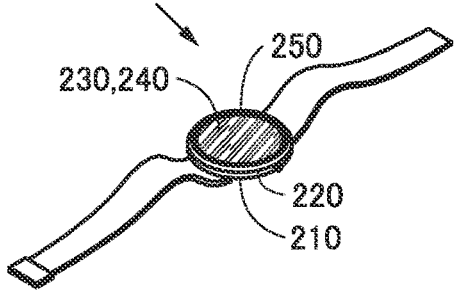

FIG. 9A is a block diagram illustrating a structure of a data processing device of one embodiment of the present invention. FIGS. 9B and 9C are projection views each illustrating an example of the appearance of a data processing device.

<Structure Example of Data Processing Device>

A data processing device 200 described in this embodiment includes an arithmetic device 210 and an input/output device 220 (see FIG. 9A). The input/output device 220 is electrically connected to the arithmetic device 210. The data processing device 200 can include a housing (see FIGS. 9B and 9C).

<<Structure Example 1 of Arithmetic Device 210>>

The arithmetic device 210 receives input data II or sensing data DS. The arithmetic device 210 generates the control data CI and the image data VI on the basis of the input data II or the sensing data DS, and supplies the control data CI and the image data VI.

The arithmetic device 210 includes an arithmetic unit 211 and a memory unit 212. The arithmetic device 210 also includes a transmission path 214 and an input/output interface 215.

The transmission path 214 is electrically connected to the arithmetic unit 211, the memory unit 212, and the input/output interface 215.

<<Arithmetic Unit 211>>

The arithmetic unit 211 has a function of executing a program, for example.

<<Memory Unit 212>>

The memory unit 212 has a function of storing, for example, a program executed by the arithmetic unit 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying and receiving data. For example, the input/output interface 215 can be electrically connected to the transmission path 214. Moreover, the input/output interface 215 can be electrically connected to the input/output device 220.

The transmission path 214 includes a wiring and has a function of supplying and receiving data. For example, the transmission path 214 can be electrically connected to the input/output interface 215. In addition, the transmission path 214 can be electrically connected to the arithmetic unit 211, the memory unit 212, or the input/output interface 215.

<<Structure Example of Input/Output Device 220>>

The input/output device 220 supplies the input data II and the sensing data DS. The input/output device 220 receives the control data CI and the image data VI (see FIG. 9A).

For example, a keyboard scan code, positional data, data on button handling, sound data, or image data can be used as the input data II. For example, data on illuminance, attitude, acceleration, direction, pressure, temperature, humidity, or the like in the environment where the data processing device 200 is used can be used as the sensing data DS.

For example, a signal for controlling the luminance, a signal for controlling the color saturation, or a signal for controlling the hue to display the image data VI can be used as the control data CI. A signal for changing part of display based on the image data VI can be used as the control data CI.

The input/output device 220 includes the display unit 230, the input unit 240, and a sensor unit 250. For example, the input/output device described in Embodiment 4 can be used as the input/output device 220. The input/output device 220 can include a communication unit 290.

<<Structure Example of Display Unit 230>>

The display unit 230 displays the image data VI on the basis of the control data CI. The display device described in Embodiment 3 can be used for the display unit 230, for example.

<<Structure Example of Input Unit 240>>

The input unit 240 generates the input data II. The input unit 240 has a function of supplying positional data, for example.

For example, a human interface or the like can be used as the input unit 240 (see FIG. 9A). Specifically, a keyboard, a mouse, a touch sensor, a microphone, a camera, or the like can be used as the input unit 240.

A touch sensor having a region overlapping with the display unit 230 can be used. Note that an input/output device that includes the display unit 230 and a touch sensor having a region overlapping with the display unit 230 can be referred to as a touch panel or a touch screen.

For example, a user can make various gestures (e.g., tap, drag, swipe, and pinch in) using a finger on the touch panel as a pointer.

For example, the arithmetic device 210 analyzes data on the position, track, or the like of the finger on the touch panel and determines that a predetermined gesture is supplied when the analysis results meet predetermined conditions. Therefore, the user can supply a certain operating instruction associated with a predetermined gesture by using the gesture.

For example, the user can supply a "scrolling instruction" for changing the position where image data is displayed, by using a gesture of moving a finger on the touch panel.

Figure 9C:
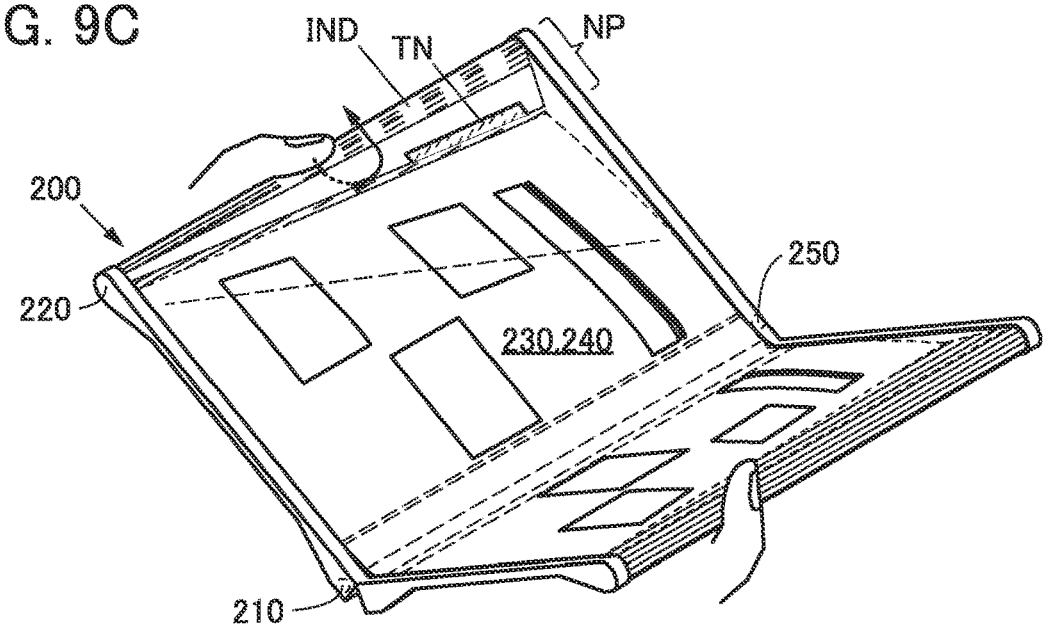

The user can supply a "dragging instruction" for pulling out and displaying a navigation panel NP at an edge portion of the region 231, by using a gesture of moving a finger touching the edge portion of the region 231 (see FIG. 9C). Moreover, the user can supply a "leafing through instruction" for displaying index images IND, some parts of other pages, or thumbnail images TN of other pages on the navigation panel NP so that the user can flip through these images in a predetermined order, by using a gesture of moving the position where a finger presses hard or by using the pressure of pressing the finger. Consequently, the user can turn the pages of an e-book reader like flipping through the pages of a paper book. Moreover, the user can search a given page with the aid of the thumbnail images TN or the index images IND.

<<Structure Example of Sensor Unit 250>>

The sensor unit 250 generates the sensing data DS. The sensor unit 250 has a function of sensing the illuminance of the environment where the data processing device 200 is used and a function of supplying illuminance data, for example.

The sensor unit 250 has a function of sensing the ambient conditions and supplying the sensing data. Specifically, the sensor unit 250 can supply data on illuminance, attitude, acceleration, direction, pressure, temperature, humidity, or the like.

For example, a photosensor, an attitude sensor, an acceleration sensor, a direction sensor, a global positioning system (GPS) signal receiving circuit, a pressure-sensitive switch, a pressure sensor, a temperature sensor, a humidity sensor, or a camera can be used as the sensor unit 250.

<<Communication Unit 290>>

The communication unit 290 has a function of supplying data to a network and acquiring data from a network.

<<Housing>>

The housing has a function of storing the input/output device 220 or the arithmetic device 210. The housing has a function of supporting the display unit 230 or the arithmetic device 210.

Accordingly, the control data CI can be generated on the basis of the input data II or the sensing data DS. The image data VI can be displayed on the basis of the input data II or the sensing data DS. The data processing device is capable of operating with knowledge of the intensity of light that the housing of the data processing device receives in the environment where the data processing device is used. The user of the data processing device can select a display method. As a result, a novel data processing device that is highly convenient, useful, or reliable can be provided.

Note that in some cases, these components cannot be clearly distinguished from each other and one component may also serve as another component or include part of another component. For example, a touch panel in which a touch sensor overlaps with a display panel serves as an input unit as well as a display unit.

<<Structure Example 2 of Arithmetic Device 210>>

The arithmetic device 210 includes an artificial intelligence (AI) unit 213 (see FIG. 9A).

The artificial intelligence unit 213 receives the input data II or the sensing data DS, and infers the control data CI on the basis of the input data II or the sensing data DS. Moreover, the artificial intelligence unit 213 supplies the control data CI.

In this manner, the control data CI for performing display which the user finds suitable can be generated. It is possible to perform display which the user finds suitable. The control data CI for performing display which the user finds comfortable can be generated. It is possible to perform display which the user finds comfortable. As a result, a novel data processing device that is highly convenient, useful, or reliable can be provided.

[Natural Language Processing on Input Data II]

Specifically, the artificial intelligence unit 213 can perform natural language processing on the input data II and extract one feature from the whole input data II. For example, the artificial intelligence unit 213 can infer emotion or the like in the input data II and regard the inference as a feature. The artificial intelligence unit 213 can also infer the color, design, font, or the like empirically felt suitable for the feature. The artificial intelligence unit 213 can also generate data specifying the color, design, or font of a letter or data specifying the color or design of the background, and use the generated data as the control data CI.

Specifically, the artificial intelligence unit 213 can perform natural language processing on the input data II and extract some words included in the input data II. For example, the artificial intelligence unit 213 can extract expressions including a grammatical error, a factual error, emotion, or the like. Moreover, the artificial intelligence unit 213 can generate data for displaying extracted part in the color, design, font, or the like different from those of another part, and use the generated data as the control data CI.

[Image Processing on Input Data II]

Specifically, the artificial intelligence unit 213 can perform image processing on the input data II and extract one feature from the input data II. For example, the artificial intelligence unit 213 can infer the age where the input data II was captured, whether the input data II was captured indoors or outdoors, or whether the input data II was captured in the daytime or at night, for example, and regard the inference as a feature. The artificial intelligence unit 213 can also infer the color tone empirically felt suitable for the feature and generate the control data CI for using the color tone for display. Specifically, data specifying color (e.g., full color, monochrome, or sepia) used for expressing a gradation can be used as the control data CI.

Specifically, the artificial intelligence unit 213 can perform image processing on the input data II and extract some images included in the input data II. For example, the artificial intelligence unit 213 can generate the control data CI for displaying a boundary between one part and another part of the extracted image. Specifically, the artificial intelligence unit 213 can generate the control data CI for displaying a rectangle surrounding part of the extracted image.

[Inference Using Sensing Data DS]

Specifically, the artificial intelligence unit 213 can make inference RI with the use of the sensing data DS. The artificial intelligence unit 213 can generate the control data CI on the basis of the inference RI so that the user of the data processing device 200 can feel comfortable.

Specifically, the artificial intelligence unit 213 can generate the control data CI for adjusting display brightness on the basis of the ambient illuminance or the like to provide comfortable display brightness. The artificial intelligence unit 213 can also generate the control data CI for adjusting volume on the basis of the ambient noise or the like to provide comfortable volume.

As the control data CI, a clock signal, a timing signal, or the like that is supplied to the control unit 238 included in the display unit 230 can be used. A clock signal, a timing signal, or the like that is supplied to a control unit included in the input unit 240 can also be used as the control data CI.

Note that this embodiment can be combined with any of the other embodiments in this specification as appropriate.

Embodiment 6

In this embodiment, a structure of a data processing device of one embodiment of the present invention will be described with reference to FIGS. 10A to 10E, FIGS. 11A to 11E, and FIGS. 12A and 12B.

Figure 10A:
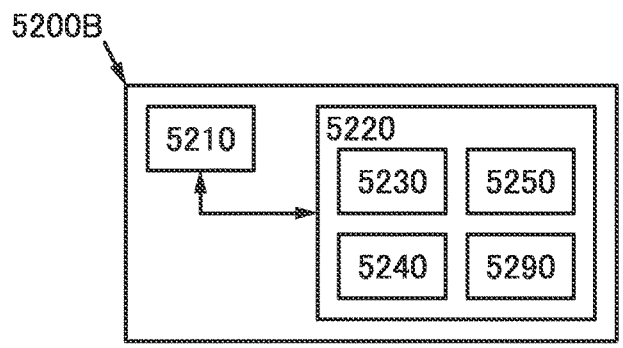
FIGS. 10A to 10E each illustrate a structure of a data processing device of one embodiment.
Figure 10B:
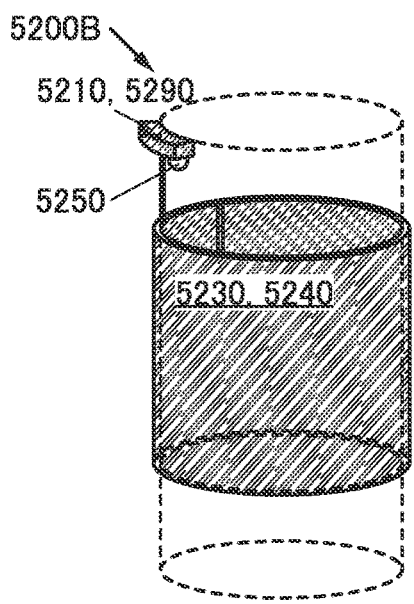
Figure 10C:
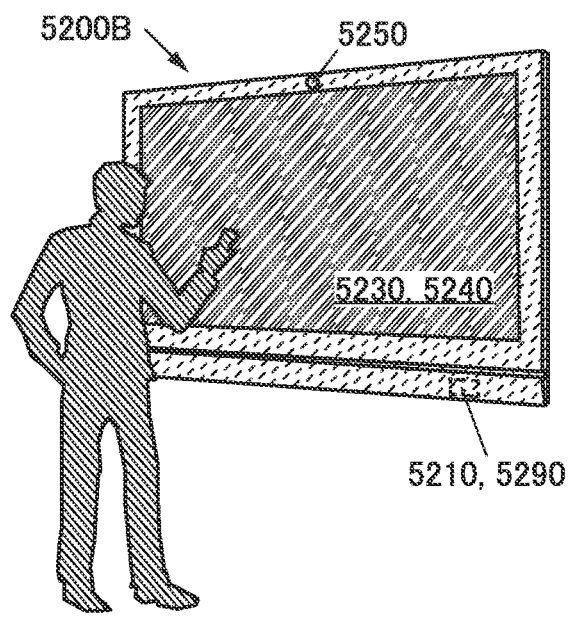
Figure 10D:
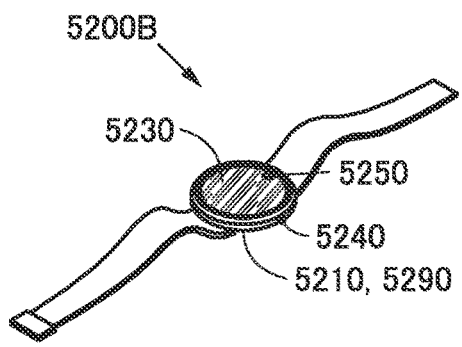
Figure 10E:
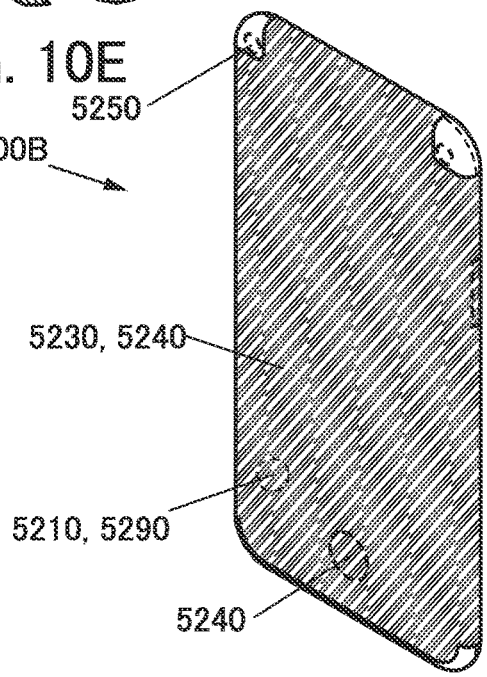
Figure 11A:
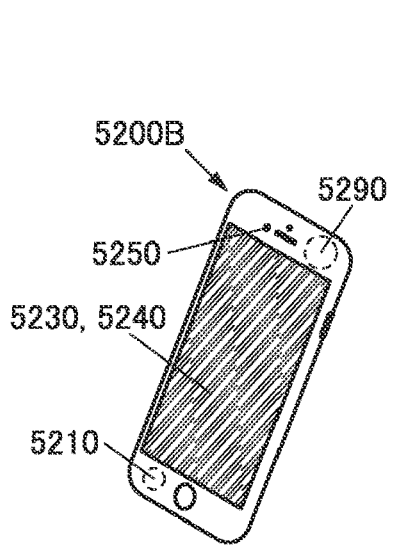
FIGS. 11A to 11E each illustrate a structure of a data processing device of one embodiment.
Figure 11B:
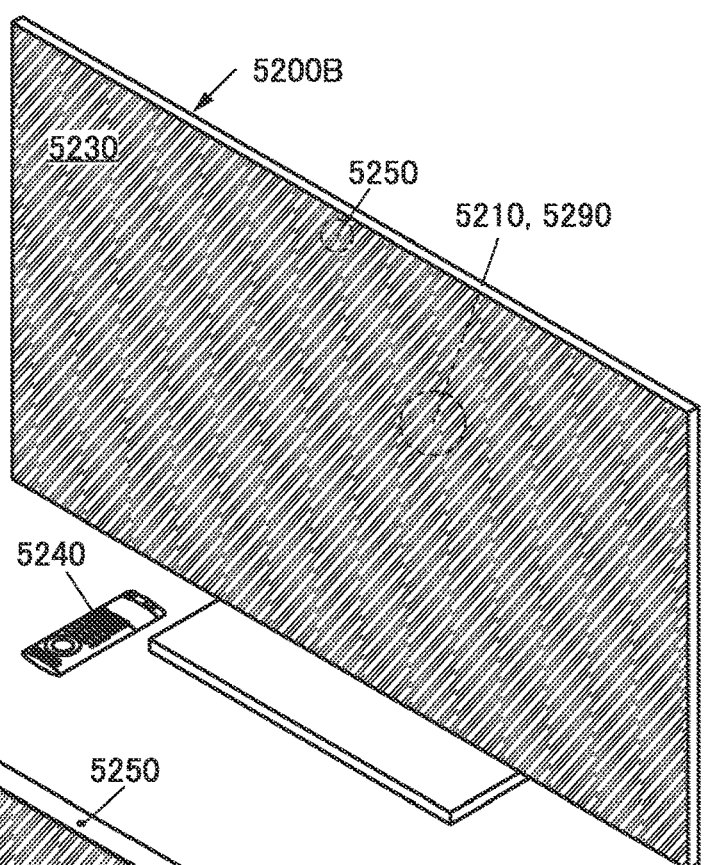
Figure 11C:
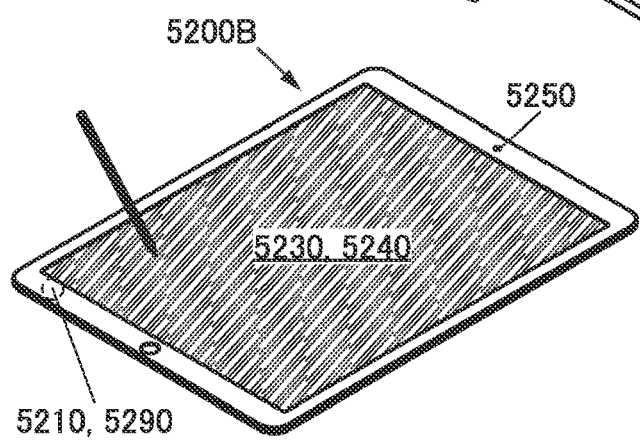
Figure 11D:
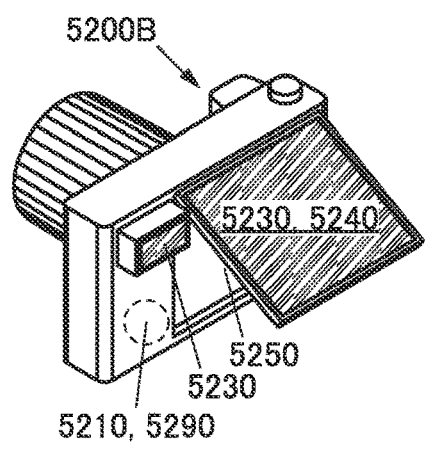
Figure 11E:
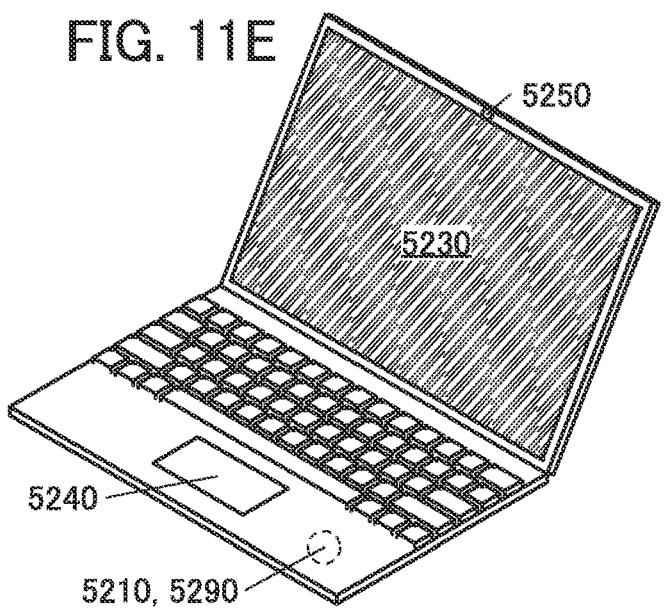
Figure 12A:
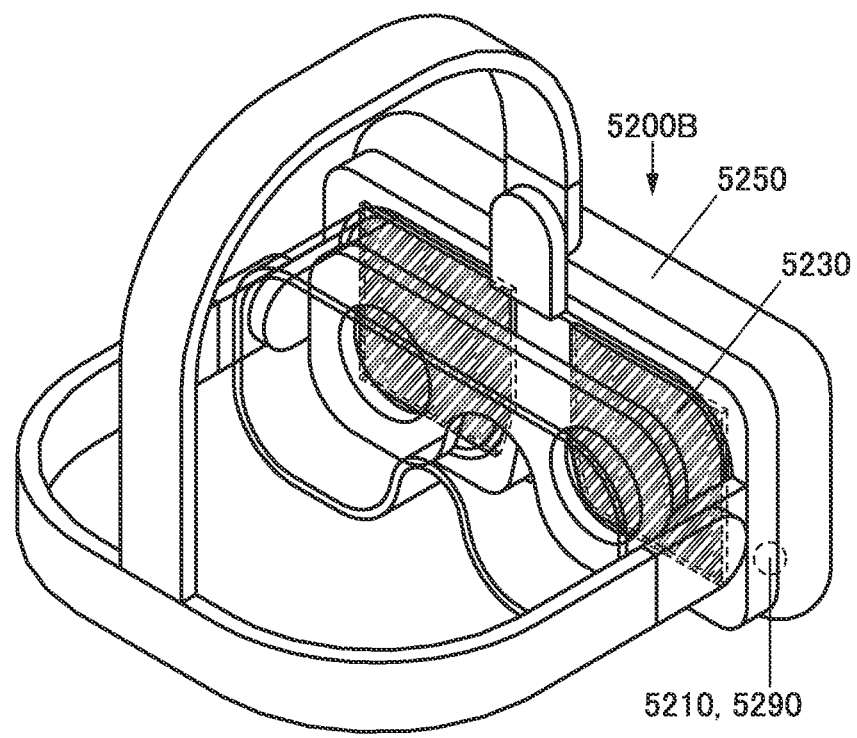
FIGS. 12A and 12B each illustrate a structure of a data processing device of one embodiment.
Figure 12B:
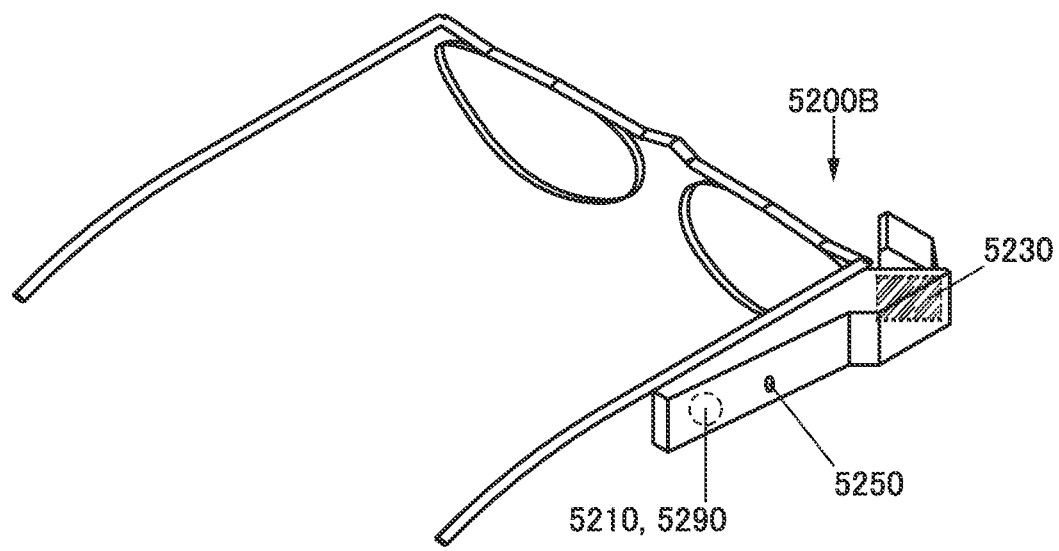

FIGS. 10A to 10E, FIGS. 11A to 11E, and FIGS. 12A and 12B illustrate structures of a data processing device of one embodiment of the present invention. FIG. 10A is a block diagram of a data processing device, and FIGS. 10B to 10E are perspective views each illustrating a structure of the data processing device. FIGS. 11A to 11E are perspective views each illustrating a structure of the data processing device. FIGS. 12A and 12B are perspective views each illustrating a structure of the data processing device.

<Data Processing Device>

A data processing device 5200B described in this embodiment includes an arithmetic device 5210 and an input/output device 5220 (see FIG. 10A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a display panel and has a function of displaying image data. For example, the display panel described in Embodiment 1 or 2 can be used in the display unit 5230.

The sensor unit 5250 has a function of supplying sensing data. For example, the sensor unit 5250 has a function of sensing a surrounding environment where the data processing device is used and supplying the sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network by wireless communication or wired communication. Specifically, the communication unit 5290 has a function of wireless local area network communication, telephone communication, near field communication, or the like.

<<Structure Example 1 of Data Processing Device>>

For example, the display unit 5230 can have an outer shape along a cylindrical column or the like (see FIG. 10B). The data processing device has a function of changing its display method in accordance with the illuminance of a usage environment. In addition, the data processing device has a function of changing the displayed content when sensing the existence of a person. Thus, for example, the data processing device can be provided on a column of a building. The data processing device can display advertising, guidance, or the like. The data processing device can be used for digital signage or the like.

<<Structure Example 2 of Data Processing Device>>

For example, the data processing device has a function of generating image data on the basis of the path of a pointer used by a user (see FIG. 10C). Specifically, a display panel with a diagonal size of 20 inches or longer, preferably 40 inches or longer, further preferably 55 inches or longer can be used. A plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

<<Structure Example 3 of Data Processing Device>>

Data received from another device can be displayed on the display unit 5230 (see FIG. 10D). Moreover, several options can be displayed. The user can choose some from the options and send a reply to the data transmitter. As another example, the data processing device has a function of changing its display method in accordance with the illuminance of a usage environment. Thus, it is possible to obtain a smartwatch with reduced power consumption, for example. As another example, it is possible to obtain a smartwatch which can display an image such that the smartwatch can be suitably used in an environment under strong external light, e.g., outdoors in fine weather.

<<Structure Example 4 of Data Processing Device>>

For example, the display unit 5230 has a surface gently curved along a side surface of a housing (see FIG. 10E). The display unit 5230 includes a display panel that has a function of displaying an image on the front surface, the side surfaces, the top surface, and the rear surface, for example. Thus, it is possible to obtain a mobile phone that can display data on not only its front surface but also its side surfaces, top surface, and rear surface, for example.

<<Structure Example 5 of Data Processing Device>>

For example, data received via the Internet can be displayed on the display unit 5230 (see FIG. 11A). The user can check a created message on the display unit 5230 and send the created message to another device. As another example, the data processing device has a function of changing its display method in accordance with the illuminance of a usage environment. Thus, it is possible to obtain a smartphone with reduced power consumption. As another example, it is possible to obtain a smartphone which can display an image such that the smartphone can be suitably used in an environment under strong external light, e.g., outdoors in fine weather.

<<Structure Example 6 of Data Processing Device>>

A remote controller can be used as the input unit 5240 (see FIG. 11B). For example, data received from a broadcast station or via the Internet can be displayed on the display unit 5230. The data processing device can take an image of the user with the sensor unit 5250 and transmit the image of the user. The data processing device can acquire a viewing history of the user and provide it to a cloud service. The data processing device can acquire recommendation data from a cloud service and display the data on the display unit 5230. A program or a moving image can be displayed on the basis of the recommendation data. As another example, the data processing device has a function of changing its display method in accordance with the illuminance of a usage environment. Accordingly, for example, it is possible to obtain a television system which can display an image such that the television system can be suitably used even when irradiated with strong external light that enters the room from the outside in fine weather.

<<Structure Example 7 of Data Processing Device>>

For example, educational materials can be received via the Internet and displayed on the display unit 5230 (see FIG. 11C). The user can input an assignment with the input unit 5240 and send it via the Internet. The user can obtain a corrected assignment or the evaluation from a cloud service and have it displayed on the display unit 5230. The user can select suitable educational materials on the basis of the evaluation and have them displayed.

For example, an image signal can be received from another data processing device and displayed on the display unit 5230. When the data processing device is placed on a stand or the like, the display unit 5230 can be used as a sub-display. Thus, for example, it is possible to obtain a tablet computer which can display an image such that the tablet computer is favorably used even in an environment under strong external light, e.g., outdoors in fine weather.

<<Structure Example 8 of Data Processing Device>>

The data processing device includes, for example, a plurality of display units 5230 (see FIG. 11D). For example, the display unit 5230 can display an image that the sensor unit 5250 is capturing. A captured image can be displayed on the sensor unit. A captured image can be decorated using the input unit 5240. A message can be attached to a captured image. A captured image can be transmitted via the Internet. The data processing device has a function of changing shooting conditions in accordance with the illuminance of a usage environment. Accordingly, for example, it is possible to obtain a digital camera that can display a subject such that an image is favorably viewed even in an environment under strong external light, e.g., outdoors in fine weather.

<<Structure Example 9 of Data Processing Device>>

For example, the data processing device of this embodiment is used as a master and another data processing device is used as a slave, whereby the other data processing device can be controlled (see FIG. 11E). As another example, part of image data can be displayed on the display unit 5230 and another part of the image data can be displayed on a display unit of another data processing device. Image signals can be supplied. Data written from an input unit of another data processing device can be obtained with the communication unit 5290. Thus, a large display region can be utilized by using a portable personal computer, for example.

<<Structure Example 10 of Data Processing Device>>

The data processing device includes, for example, the sensor unit 5250 that senses an acceleration or a direction (see FIG. 12A). The sensor unit 5250 can supply data on the position of the user or the direction in which the user faces. The data processing device can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensor unit 5250 that senses an acceleration or a direction (see FIG. 12B). The sensor unit 5250 can supply data on the position of the user or the direction in which the user faces. The data processing device can generate image data in accordance with the position of the user or the direction in which the user faces. Accordingly, the data can be shown together with a real-world scene, for example. Alternatively, an augmented reality image can be displayed on a glasses-type data processing device.

Note that this embodiment can be combined with any of the other embodiments in this specification as appropriate.

Embodiment 7

In this embodiment, a structure example of an electronic device including the functional panel of one embodiment of the present invention will be described.

Figure 13A:
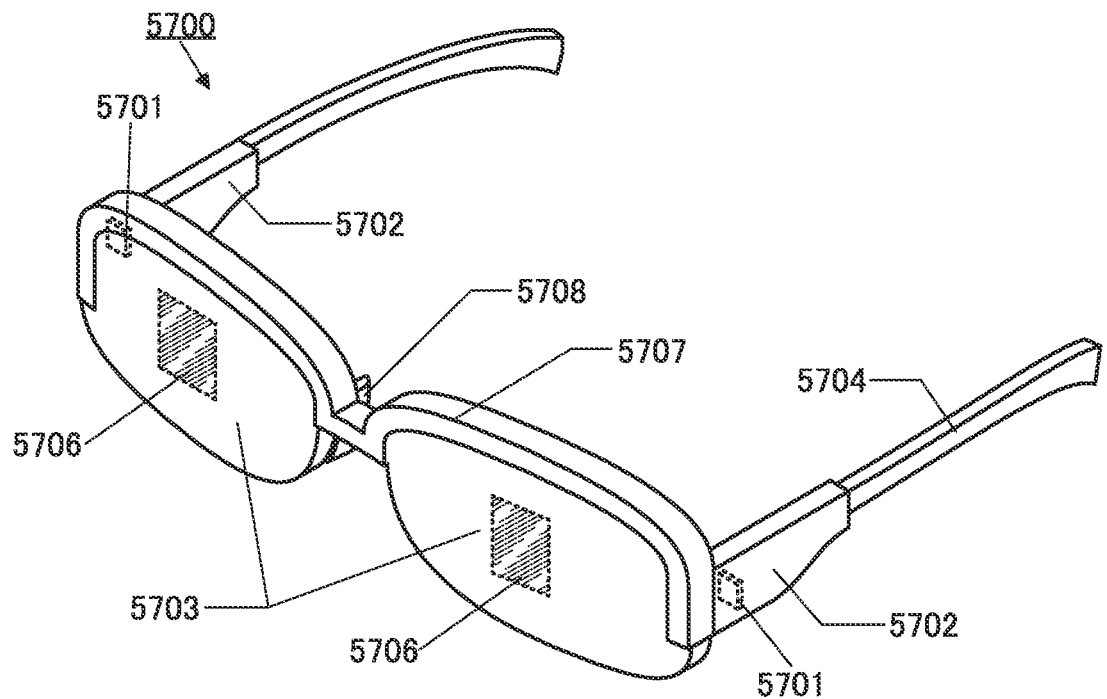
FIGS. 13A and 13B illustrate a structure example of an electronic device.

FIG. 13A is a perspective view of a glasses-type electronic device 5700. The electronic device 5700 includes a pair of display panels 5701, a pair of housings 5702, a pair of optical members 5703, a pair of wearing portions 5704, a frame 5707, a nose pad 5708, and the like.

The electronic device 5700 can project an image displayed on the display panel 5701 onto a display region 5706 of the optical member 5703. Since the optical members 5703 have a light-transmitting property, a user can see images displayed on the display regions 5706, which are superimposed on transmission images seen through the optical members 5703. Thus, the electronic device 5700 is an electronic device capable of AR display.

One or both of the housings 5702 may be provided with a camera capable of taking an image of what lies in front thereof. The housing 5702 may have a wireless communication device, in which case a video signal or the like can be supplied to the housing 5702 by the wireless communication device. Instead of or in addition to the wireless communication device, a connector that can be connected to a cable for supplying a video signal or a power supply potential may be provided. Furthermore, when the housing 5702 is provided with an acceleration sensor such as a gyroscope sensor, the orientation of the user's head can be detected and an image corresponding to the orientation can be displayed on the display region 5706.

One or both of the housings 5702 may be provided with a processor. The processor has a function of controlling the components of the electronic device 5700, such as a camera, a wireless communication device, and the pair of display panels 5701, a function of generating an image, and the like. The processor may have a function of generating a synthesized image for AR display.

Furthermore, data communication with an external device can be performed by the wireless communication device. For example, when data transmitted from the outside is output to the processor, the processor can generate image data for AR display on the basis of the data. Examples of the data transmitted from the outside include, in addition to image data, data including biological information transmitted from a biological sensor device or the like.

Next, a method for projecting an image on the display region 5706 of the electronic device 5700 is described with reference to FIG. 13B. The display panel 5701 is provided inside the housing 5702. Furthermore, a reflective plate 5712 is provided in the optical member 5703, and a reflective surface 5713 functioning as a half mirror is provided in a portion corresponding to the display region 5706 of the optical member 5703.

Light 5715 emitted from the display panel 5701 is reflected by the reflective plate 5712 to the optical member 5703 side. In the optical member 5703, the light 5715 is fully reflected repeatedly by surfaces of an edge portion of the optical member 5703 and reaches the reflective surface 5713, whereby an image is projected on the reflective surface 5713. Accordingly, the user can see both the light 5715 reflected by the reflective surface 5713 and transmitted light 5716 that passes through the optical member 5703 (including the reflective surface 5713).

Figure 13B:
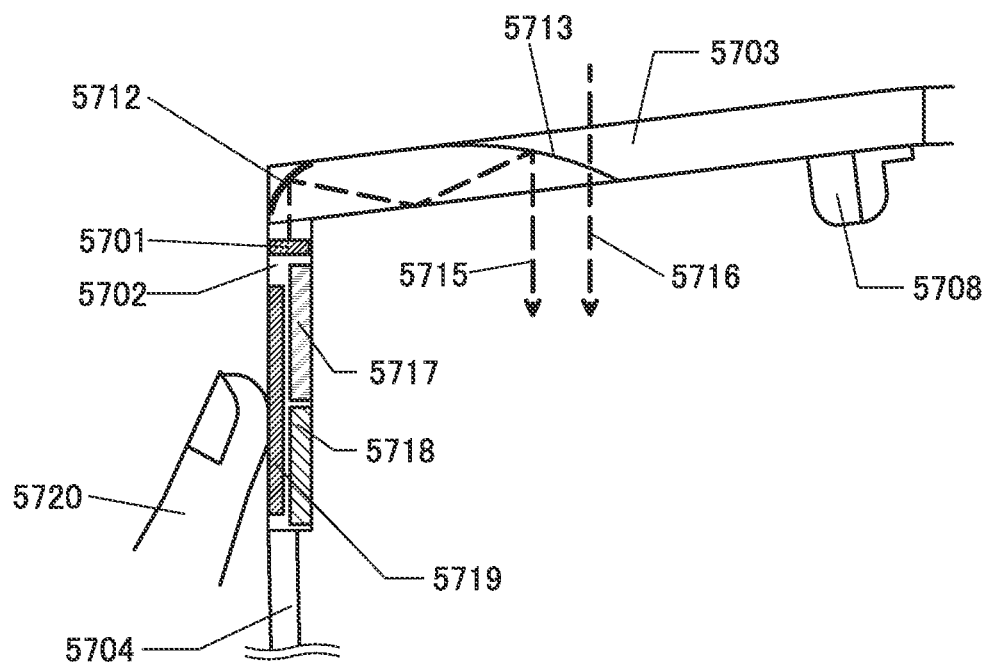

FIGS. 13A and 13B show an example in which the reflective plate 5712 and the reflective surface 5713 each have a curved surface. This structure can increase optical design flexibility and reduce the thickness of the optical member 5703, compared to the case where the reflective plate 5712 and the reflective surface 5713 are flat. Note that the reflective plate 5712 and the reflective surface 5713 may be flat.

The reflective plate 5712 can be a component having a mirror surface and preferably has high reflectance. As the reflective surface 5713, a half mirror utilizing reflection of a metal film may be used, but the use of a total-reflection prism or the like can increase the transmittance of the transmitted light 5716.

The housing 5702 may include a lens between the display panel 5701 and the reflective plate 5712. In this case, the housing 5702 preferably includes a mechanism for adjusting the distance and angle between the lens and the display panel 5701, in which case the focus can be adjusted and images can be zoomed in and out. One or both of the lens and the display panel 5701 is preferably configured to be movable in the optical-axis direction, for example.

The housing 5702 preferably includes a mechanism capable of adjusting the angle of the reflective plate 5712. The position of the display region 5706 where images are displayed can be changed by changing the angle of the reflective plate 5712. Thus, the display region 5706 can be placed at the most appropriate position in accordance with the position of the user's eye.

Furthermore, the housing 5702 is preferably provided with a battery 5717 and a wireless power supply module 5718. With the battery 5717, the electronic device 5700 can be used without being connected to a battery, and thus can have higher convenience. In addition, the wireless power supply module 5718 enables wireless charging, leading to higher convenience and higher design property. Furthermore, the wireless charging can reduce the risk of malfunction due to a defective contact or the like compared to wired charging through a connector or the like, leading to higher reliability of the electronic device 5700.

The housing 5702 is provided with a touch sensor module 5719. The touch sensor module 5719 has a function of detecting a touch on the outer surface of the housing 5702. FIG. 13B illustrates a state where the outer surface of the housing 5702 is touched by a finger 5720. Detecting a tap or slide operation by a user with the touch sensor module 5719 enables a variety of processings. For example, a video can be paused or restarted by a tap operation, or can be fast-forwarded or fast-reversed by a slide operation. Furthermore, when the touch sensor module 5719 is provided for each of the two housings 5702, more kinds of operations can be performed.

A variety of touch sensors can be used for the touch sensor module 5719. For example, any of touch sensors of the following types can be used: a capacitive type, a resistive type, an infrared type, an electromagnetic induction type, a surface acoustic wave type, and an optical type. In particular, a capacitive touch sensor or an optical sensor is preferably used for the touch sensor module 5719.

In the case of using an optical touch sensor, a photoelectric conversion element can be used as a light-receiving element. The photoelectric conversion element includes an inorganic semiconductor or an organic semiconductor in its active layer, for example.

The display device or the functional panel of one embodiment of the present invention can be used for the display panel 5701. Thus, the electronic device 5700 capable of extremely-high-resolution display can be obtained.

At least part of this embodiment can be implemented in appropriate combination with any of the other embodiments described in this specification.

When this specification and the like explicitly states that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without the element that allows electrical connection between X and Y provided therebetween.

For example, in the case where X and Y are electrically connected, at least one element that enables electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is turned on or off to determine whether current flows therethrough or not. Alternatively, a switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even if another circuit is provided between X and Y, X and Y are regarded as being functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit description "X and Y are electrically connected" is considered to be disclosure of the same contents as ones using a simple and explicit description "X and Y are connected" in this specification and the like.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path through the transistor between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path"; and "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples, and there is no limitation on the expressions. Here, X, Y, Z1, and Z2 each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also serves as an electrode, one conductive film serves as the wiring and the electrode. Thus, the term "electrical connection" in this specification also means such a case where one conductive film has functions of a plurality of components.

This application is based on Japanese Patent Application Serial No. 2019-210591 filed with Japan Patent Office on Nov. 21, 2019, the entire contents of which are hereby incorporated by reference.

What is claimed is:

1. A functional panel comprising:
a light-emitting region comprising a first element;
a first functional layer over the light-emitting region, the first functional layer comprising a first insulating film; and
a second functional layer over the first functional layer, the second functional layer comprising a driver circuit and a second insulating film,
wherein the first element comprises:
a first electrode;
a second electrode; and
a layer containing a light-emitting material,
wherein the layer containing the light-emitting material contains gallium nitride,
wherein the layer containing the light-emitting material includes a region between the first electrode and the second electrode,
wherein the first insulating film includes a first opening and a second opening on an outside of a portion where the first insulating film overlaps with the light-emitting region,
wherein the second insulating film includes a third opening and a fourth opening,
wherein the first opening is overlapping with the third opening,
wherein the second opening is overlapping with the fourth opening,
wherein the driver circuit comprises:
a first transistor electrically connected to the first electrode through the first opening and the third opening; and
a second transistor electrically connected to the second electrode through the second opening and the fourth opening, and
wherein the driver circuit and the light-emitting region overlap each other.

2. A data processing device comprising:
an arithmetic device; and
an input/output device,
wherein the arithmetic device is configured to be supplied with input data or sensing data,
wherein the arithmetic device is configured to generate control data and image data from the input data or the sensing data,
wherein the arithmetic device is configured to supply the control data and the image data, wherein the input/output device is configured to supply the input data and the sensing data,
wherein the input/output device is configured to be supplied with the control data and the image data,
wherein the input/output device comprises a display unit, an input unit and a sensor unit,
wherein the display unit comprises the functional panel according to claim 1,
wherein the display unit is configured to display the image data by the control data,
wherein the input unit is configured to generate the input data, and
wherein the sensor unit is configured to generate the sensing data.

3. A data processing device comprising:
at least one of a keyboard, a hardware button, a pointing device, a touch sensor, an illuminance sensor, an imaging device, an audio input device, an eye-gaze input device, and an attitude sensing device; and
the functional panel according to claim 1.

4. The functional panel according to claim 1,
wherein the first opening comprises a first metal,
wherein the third opening comprises a second metal, and
wherein the first metal is in contact with the second metal.

5. The functional panel according to claim 1,
wherein the first insulating film contains silicon and oxygen,
wherein the second insulating film contains silicon and oxygen, and
wherein the first insulating film comprises a region bonded to the second insulating film.

6. The functional panel according to claim 1,
wherein the first transistor comprises single crystal silicon.

7. A functional panel comprising:
a first functional layer comprising a first insulating film and a second insulating film,
a second functional layer comprising a third insulating film in contact with the first insulating film and a first driver circuit comprising a first transistor,
a first pixel between the first insulating film and the second insulating film, the first pixel comprising a first element; and
a second pixel between the first insulating film and the second insulating film, the second pixel comprising a second element,
wherein the second insulating film is configured to separate the second element from the first element,
wherein the first element is configured to emit light,
wherein the first element comprises a first electrode, a second electrode, and a layer containing a light-emitting material,
wherein the layer containing the light-emitting material contains gallium nitride,
wherein the first insulating film comprises a first opening and a second opening,
wherein the third insulating film comprises a third opening and a fourth opening,
wherein the first opening is overlapping with the third opening,
wherein the second opening is overlapping with the fourth opening,
wherein the first transistor is electrically connected to the first electrode through the first opening and the third opening,
wherein the second functional layer comprises a second driver circuit comprising a second transistor, and wherein the second transistor is electrically connected to the second electrode through the second opening and the fourth opening.

8. The functional panel according to claim 7,
wherein the first insulating film comprises a fourth insulating film containing silicon and oxygen,
wherein the second insulating film comprises:
    a fifth insulating film comprising a region bonded to the fourth insulating film, the fifth insulating film containing silicon and oxygen; and
    a sixth insulating film between the fifth insulating film and the first transistor, the sixth insulating film containing silicon and nitrogen, and
wherein the first transistor comprises single crystal silicon.

9. The functional panel according to claim 7,
wherein each of the first element and the second element is configured to emit light with a first color,
wherein the first pixel comprises a color conversion layer configured to convert light with the first color into light with a second color, and
wherein the second pixel is configured to display light with the first color.

10. The functional panel according to claim 7, further comprising:
a first pixel set comprising the first pixel and the second pixel, the first pixel set being arranged in a row direction;
a second pixel set comprising the first pixel and the second pixel, the second pixel set being arranged in a column direction intersecting the row direction;
a first conductive film electrically connected to the first pixel set; and
a second conductive film electrically connected to the second pixel set,
wherein each of the first pixel set and the second pixel set comprises the first pixel and the second pixel.

11. A display device comprising:
a control unit; and
the functional panel according to claim 7,
wherein the control unit is configured to be supplied with image data and control data,
wherein the control unit is configured to generate an image signal from the image data,
wherein the control unit is configured to generate a control signal from the control data,
wherein the control unit is configured to supply the image signal and the control signal,
wherein the functional panel is configured to be supplied with the image signal and the control signal, and
wherein the first pixel and the second pixel are configured to perform display using the image signal.

12. An input/output device comprising:
an input unit comprising a sensing region; and
a display unit comprising the functional panel according to claim 7,
wherein the input unit is configured to sense an object approaching the sensing region, and
wherein the sensing region and each of the first pixel and the second pixel overlap each other.

13. A data processing device comprising:
an arithmetic device; and
an input/output device,
wherein the arithmetic device is configured to be supplied with input data or sensing data,
wherein the arithmetic device is configured to generate control data and image data from the input data or the sensing data,
wherein the arithmetic device is configured to supply the control data and the image data,
wherein the input/output device is configured to supply the input data and the sensing data,
wherein the input/output device is configured to be supplied with the control data and the image data,
wherein the input/output device comprises a display unit, an input unit and a sensor unit,
wherein the display unit comprises the functional panel according to claim 7,
wherein the display unit is configured to display the image data by the control data,
wherein the input unit is configured to generate the input data, and
wherein the sensor unit is configured to generate the sensing data.

14. A data processing device comprising:
at least one of a keyboard, a hardware button, a pointing device, a touch sensor, an illuminance sensor, an imaging device, an audio input device, an eye-gaze input device, and an attitude sensing device; and
the functional panel according to claim 7.

15. The functional panel according to claim 7,
wherein the first opening comprises a first metal,
wherein the third opening comprises a second metal, and
wherein the first metal is in contact with the second metal.

16. The functional panel according to claim 7,
wherein the first insulating film contains silicon and oxygen,
wherein the third insulating film contains silicon and oxygen, and
wherein the first insulating film comprises a region bonded to the third insulating film.

17. The functional panel according to claim 7,
wherein the first transistor comprises single crystal silicon.

* * * * *